(12) United States Patent
Murakawa et al.

(10) Patent No.: US 6,388,632 B1
(45) Date of Patent: May 14, 2002

(54) SLOT ANTENNA USED FOR PLASMA SURFACE PROCESSING APPARATUS

(75) Inventors: Shigehiro Murakawa; Kenji Tanaka; Takahiro Arakawa, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/537,370

(22) Filed: Mar. 29, 2000

(30) Foreign Application Priority Data

| Mar. 30, 1999 | (JP) | 11-089281 |
| Mar. 30, 1999 | (JP) | 11-089282 |
| Mar. 30, 1999 | (JP) | 11-089283 |
| Mar. 30, 1999 | (JP) | 11-089285 |
| Jan. 18, 2000 | (JP) | 12-008649 |

(51) Int. Cl.⁷ .......................... H01Q 13/10; H05H 1/00
(52) U.S. Cl. .................. 343/770; 343/771; 156/345; 118/723 MW
(58) Field of Search .................. 343/770, 771, 343/767, 768; 118/723 MW, 715; 156/345; H01Q 13/10; H05H 1/00

(56) References Cited

U.S. PATENT DOCUMENTS

4,819,003 A * 4/1989 Goto et al. .............. 343/771
5,661,498 A * 8/1997 Goto et al. .............. 343/771

FOREIGN PATENT DOCUMENTS

JP  A 10-12594  6/1996

OTHER PUBLICATIONS

*Ultra Clean Technology*, vol. 9 Supplemental, 1997, Ohmi, Tadahiro, "New Era of Semiconductor Manufacturing (1)".

* cited by examiner

*Primary Examiner*—Hoanganh Le
(74) *Attorney, Agent, or Firm*—Merchant & Gould P.C.

(57) ABSTRACT

A slot antenna includes an antenna guide formed with a recess, a dielectric member received in the recess, a slot plate held in contact with the dielectric member; and a waveguide connected to the antenna guide for introduction of microwaves. The slot plate is uniformly supported by the dielectric member. Alternatively, the slot plate is provided with an expansion absorbing region, so that the slot plate is displaceable relative to the dielectric member.

16 Claims, 18 Drawing Sheets

SLOT ANTENNA USED FOR PLASMA SURFACE PROCESSING APPARATUS

BACKGROUND OF THE INVENTION

1. Field of the Invention

The present invention relates to a slot antenna incorporated in a plasma surface processing apparatus used for processing the surface of a semiconductor substrate such as a silicon wafer. More particularly, the present invention relates to a radial line slot antenna.

2. Description of the Related Art

As is well known, a typical radial line slot antenna utilized in a plasma surface processing apparatus is provided with a metal antenna guide (made of e.g. aluminum) and a disklike dielectric member (made of e.g. quartz or alumina ceramic) supported by the antenna guide. The antenna guide is formed, at its lower side, with a circular recess for accommodating the dielectric member. The slot antenna is also provided with a metal slot plate arranged under the dielectric member. The slot plate, formed with a plurality of slots, extends in parallel to the dielectric member. A microwave waveguide is connected to a central portion of the upper surface of the antenna guide. An electrical conductor extends through the inside of the waveguide to be connected to the slot plate.

In operation, microwaves led into the antenna guide are caused to propagate through the dielectric member radially outward of the dielectric member. Then, the radiated microwaves are ejected downward through the slots formed in the slot plate. Consequently, plasma is generated between the slot plate and a semiconductor substrate placed on the upper surface of a lower electrode disposed below the slot plate. The plasma thus generated is advantageously used not only for forming the various types of coatings on the semiconductor substrate but also for subjecting the semiconductor substrate to surface processing (e.g. etching).

Conventionally, the slot plate, which is rendered diametrically greater than the dielectric member, is attached, at its peripheral portions, to the antenna guide by screws. The conventional arrangement of the slot antenna has been found to have the following disadvantages.

In operation, the slot plate is heated up when plasma is generated. Since the dielectric member arranged above the slot plate has a low thermal conductivity (which is intrinsic of quartz and alumina ceramic), the heat accumulated in the slot plate is hardly absorbed by the dielectric member. Instead, the accumulated heat is conducted to the antenna guide only through the screwed peripheral portions of the slot plate. Due to this, thermal expansion of the slot plate tends to be greater at inner portions than at the peripheral portions, thereby causing the slot plate to unduly bulge downward. As a result, the clearance between the deformed slot plate and the semiconductor substrate will become uneven, whereby microwave radiation for generating plasma cannot be performed uniformly. Consequently, the plasma generation necessary for processing the semiconductor substrate will be rendered nonuniform and unstable, which is disadvantageous in performing proper surface processing for the semiconductor substrate.

To address the above problem, the slot plate may be attached, at its inner portions, to the dielectric member by screws additional to the peripheral screws connecting the slot plate to the antenna guide. In this manner, however, the heated slot plate will still be apt to bulge downward at unscrewed portions.

SUMMARY OF THE INVENTION

The present invention has been proposed under the above circumstances, and its object is to reliably reduce or even eliminate the unfavorable thermal deformation of a slot plate of a slot antenna.

According to a first aspect of the present invention, there is provided a slot antenna comprising:

a metal antenna guide formed with a recess;

a dielectric member received in the recess;

a metal slot plate held in contact with the dielectric member; and a waveguide connected to the antenna guide for introduction of microwaves;

wherein the slot plate is uniformly supported by the dielectric member.

With such an arrangement, it is possible to prevent the slot plate from being unduly deformed downward even if the slot plate is heated.

Preferably, the slot plate may comprise a metal layer which is closely attached to the dielectric member.

Preferably, the metal layer may be formed by electroless plating. In this way, the metal layer is formed faster and at lower cost than when it is formed by applying and baking conductive paste. Further, the thickness of the resulting metal layer is advantageously uniform as a whole.

In a preferred embodiment, a protection coating may be provided for covering the metal layer.

In another preferred embodiment, at least part of the slot plate may be embedded in the dielectric member. In this manner again, downward thermal deformation of the slot plate is reliably prevented.

The slot plate may include more than one conductive layer. For instance, the slot plate may comprise a copper-plated layer and a nickel-plated layer. Of course, a conductive layer is not limited to these examples.

In a preferred embodiment, the slot plate may be provided with an annular upright portion to be held in contact with the antenna guide when the dielectric member is fitted into the recess. In this manner, the slot plate is reliably connected to the antenna guide.

Preferably, the slot antenna may further comprise a fixing piece fitted into the dielectric member. The fixing piece may be connected to the waveguide.

According to a second aspect of the present invention, there is provided a slot antenna comprising:

a metal antenna guide formed with a recess;

a dielectric member received in the recess;

a metal slot plate held in contact with the dielectric member; and a waveguide connected to the antenna guide for introduction of microwaves;

wherein the slot plate is provided with expansion absorbing means.

With such an arrangement, thermal expansion of the slot plated is advantageously reduced or eliminated by the expansion absorbing means. Thus, even if the slot plate is not firmly fixed to the dielectric member, unfavorable thermal deformation of the slot plate is effectively prevented.

In a preferred embodiment, the slot plate may include inner and outer members defined by a series of openings formed in the slot plate and arranged in a circle.

Preferably, the inner member and the outer member may be connected by deformable linking members.

Preferably, the series of openings of the slot plate may be closed by the antenna guide. Alternatively, these openings may be closed by suitable metal pieces which may be mounted on the dielectric member or slot plate itself or other members.

In a preferred embodiment, the slot plate may be positionally fixed at a central portion thereof as well as at peripheral portions thereof.

Preferably, the slot antenna may further comprise urging means for pressing a peripheral portion of the slot plate against the antenna guide. The urging means may be springs such as coned disc springs.

The slot antenna may further comprise a second dielectric member arranged under the slot plate for supporting the slot plate. In place of the second dielectric member, use may be made of a metal supporting member arranged under the slot plate for supporting the slot plate. In this instance, the metal supporting member may be formed with a plurality of openings for exposing the slot plate.

Preferably, the dielectric member may be made of AlN ceramic material.

In a preferred embodiment, the antenna guide may be formed with a groove extending around the recess for circulating coolant. The groove may be closed by the slot plate.

The slot antenna may further comprise an additional dielectric member arranged in facing relation to the slot plate so that a hermetical passage for circulating nonconductive coolant is formed between the additional dielectric member and the slot plate.

Preferably, the additional dielectric member may be arranged parallel to the slot plate.

Other features and advantages of the present invention will become apparent from the detailed description given below with reference to the accompanying drawings.

DETAILED DESCRIPTION OF THE PREFERRED EMBODIMENTS

The preferred embodiments of the present invention will be described below with reference to the accompanying drawings. Throughout these figures, identical or similar parts are designated by the same numerals or signs, and detailed description about them may not be repeated.

Figure 1:
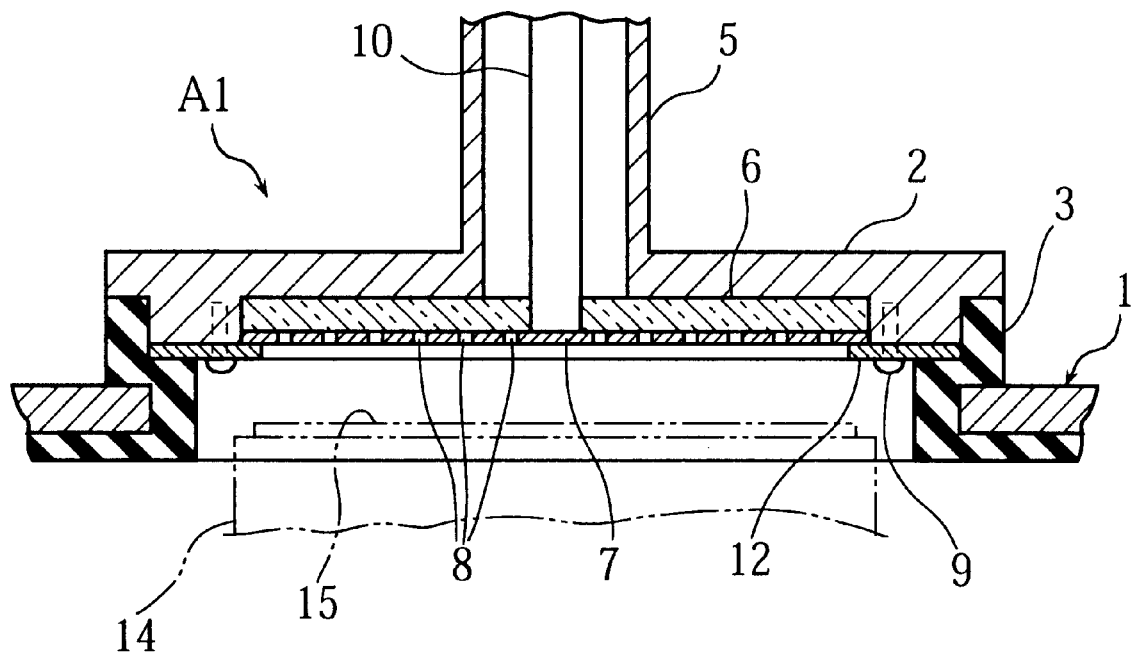
FIG. 1 is a sectional side view showing a slot antenna according to a first embodiment of the present invention.
Figure 2:
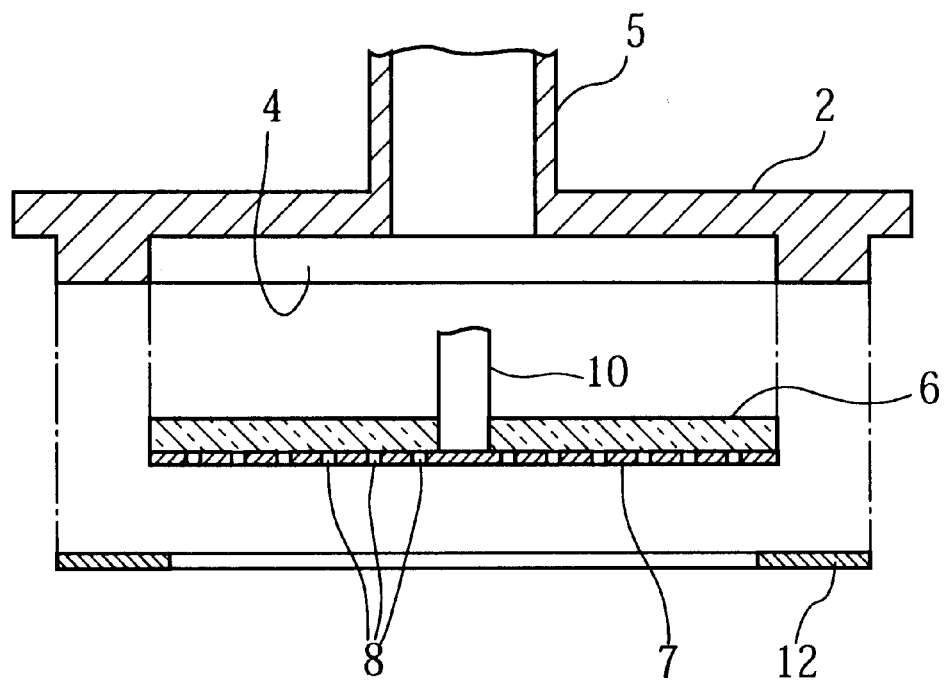
FIG. 2 is a sectional exploded view showing the slot antenna of FIG. 1.
Figure 3:
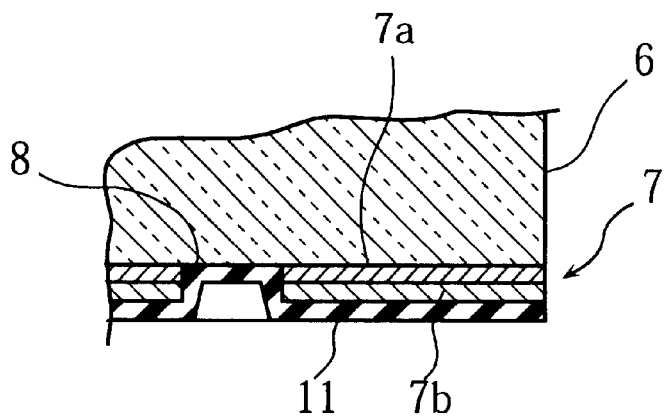
FIG. 3 is an enlarged view showing a principal portion of the slot antenna of FIG. 1.

Reference is first made to FIGS. 1 to 3 illustrating a radial line slot antenna A1 according to a first embodiment of the present invention. The slot antenna A1 is incorporated in a plasma surface processing apparatus used for performing surface processing of a semiconductor substrate such as a wafer. Specifically, the plasma surface processing apparatus is provided with a chamber 1 on an upper portion of which the slot antenna A1 is mounted via an insulating member 3.

The slot antenna A1 includes an antenna guide 2 made of e.g. aluminum. As best shown in FIG. 2, the antenna guide 2 is formed, at its bottom surface, with a downwardly open recess 4 of a constant depth. The recess 4 may be rather flat or shallow. On the upper side, the antenna guide 2 is connected, at its central portion, to a waveguide 5 for introducing microwaves into the recess 4.

Numeral 6 refers to a disk-like dielectric member made of quartz or alumina ceramic for example. The dielectric member 6 and the above-mentioned recess 4 have complementary configurations so that the dielectric member 6 is releasably fitted into the recess 4. The lower surface of the dielectric member 6 is closely contacted with a slot plate 7. As will be described in detail below, the slot plate 7 is formed with a plurality of through-holes or slots 8.

As shown in FIGS. 1 and 2, the dielectric member 6 (together with the slot plate 7) is fitted in the recess 4, and fixed in position by a metal ring member 12 attached to the antenna guide 2 by a suitable number of screws 9. As best shown in FIG. 1, the ring member 12 comes into contact with only the rim of the slot plate 7 uncovered. Through such peripheral contact with the conductive ring member 12, proper electrical connection is made between the slot plate 7 and the antenna guide 2. The slot plate 7 is also electrically connected to the upper surface of the slot plate 7.

As shown by double-dot chain lines in FIG. 1, a lower electrode 14 is provided under the slot plate 7. A semiconductor substrate 15 is mounted on the lower electrode 14 to be subjected to surface processing.

Referring to FIG. 3, the slot plate 7 of the first embodiment is made up of two layers: a base layer 7a and an overlapping layer 7b. The base layer 7a is formed by applying material paste on the lower surface of the dielectric member 6. Specifically, the material paste, containing e.g. silver and palladium, is screen-printed on the lower surface of the dielectric member 6. At this stage, the material paste is printed in a predetermined pattern so that the above-mentioned slots 8 will result. Then, the applied material paste is dried and baked. After being thus formed, the base layer 7a is subjected to silver-plating, so that the overlapping layer 7b is formed on the exposed surface (in FIG. 3, the lower surface) of the base layer 7a. In this manner, the slot plate 7 may be made up of two thin layers.

As seen from the above, the entirety of the resulting slot plate 7 is uniformly fixed to the dielectric member 6. Thus, unfavorable deformation of the slot plate 7 upon heating is reliably prevented. Further, when the slot plate 7 (i.e., the base layer 7a and/or the overlapping layer 7b) is reduced in thickness, the heat capacity of the slot plate 7 can be lowered. Consequently, the deformation of the slot plate 7 will be prevented more reliably.

For protecting the slot plate 7 from possible damage, a protection coating 11 may preferably be formed on the slot plate 7, as shown in FIG. 3. The protection coating 11 may be made of glass, heat-resistant synthetic resin, or dielectric material.

In the first embodiment described above, the slot plate 7 is made up of the two layers 7a, 7b, though the present invention is not limited to this. Alternatively, the slot plate 7 may include only one layer or more than two layers. Such a single layer or multiple layers may be formed by subjecting suitable material to screen-printing, plating or sputtering for example. The respective slots 8 may be formed by etching a layer (or layers) formed on the dielectric member 6.

Figure 4:
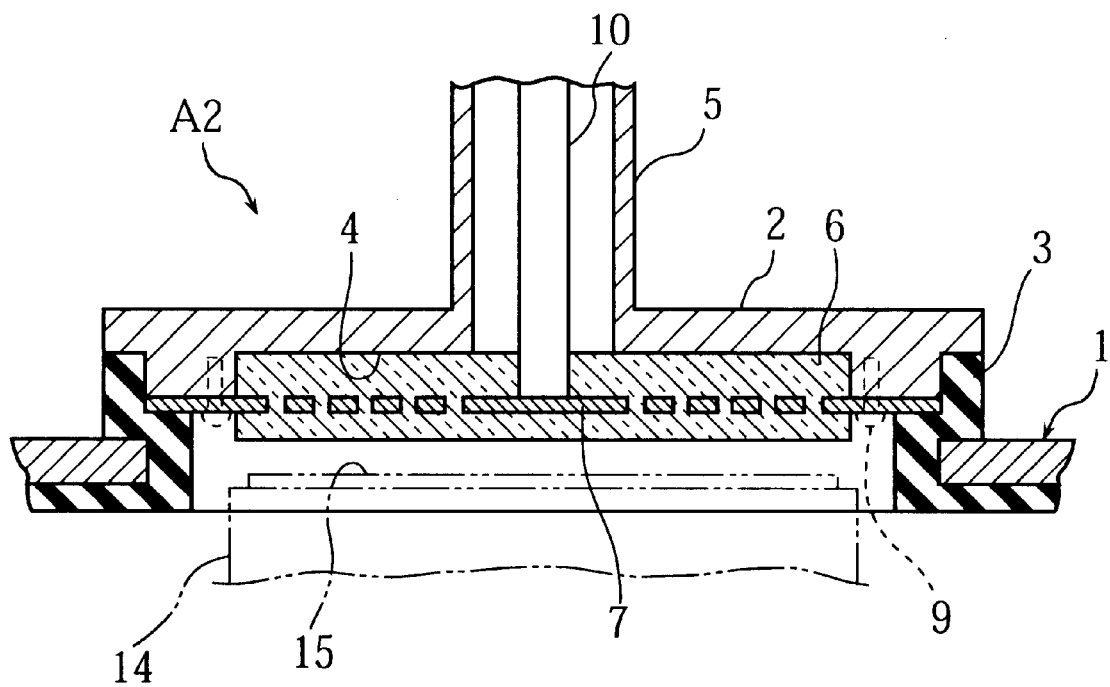
FIG. 4 is a sectional side view showing a slot antenna according to a second embodiment of the present invention.
Figure 5:
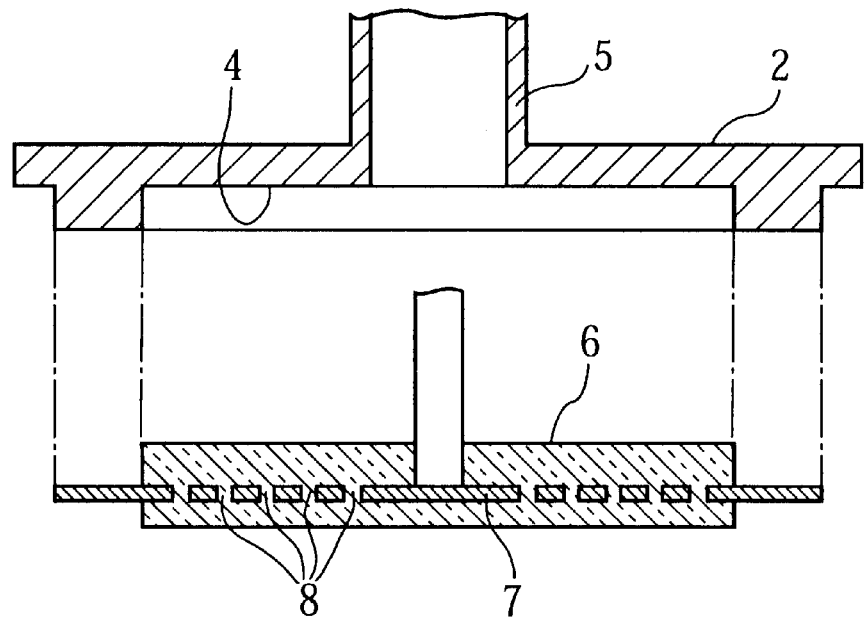
FIG. 5 is a sectional exploded view showing the slot antenna of FIG. 4.

Referring now to FIGS. 4 and 5, a radial line slot antenna A2 according to a second embodiment of the present invention will be described.

As in the first embodiment, the slot antenna A2 of the second embodiment includes an antenna guide 2 supported by a chamber 1 via an insulating member 3. The antenna guide 2 is formed with a downwardly open recess 4. An upright waveguide 5 extends from a central portion of the upper surface of the antenna guide 2.

The recess 4 of the antenna guide 2 receives a dielectric member 6 in the thickness of which a metal slot plate 7 is embedded partially. Specifically, a radially inner portion of the slot plate 7 is enclosed by the dielectric member 6, while a peripheral portion of the slot plate 7 is rendered to horizontally protrude from the annular side surface of the dielectric member 6. Such construction may be provided by applying a dielectric material on both sides of the slot plate 7 (with the slots 8 formed beforehand) and then baking the applied material. The slot plate 7 is formed with a plurality of slots 8 (FIG. 5) and connected to a conductor 10 extending through the waveguide 5.

As shown in FIG. 4, the protruding peripheral portion of the slot plate 7 is fixed to the bottom side of the antenna guide 2 via a suitable number of screws 9. Under the dielectric member 6, a lower electrode 14 is provided, upon which a semiconductor substrate 15 is placed.

According to the second embodiment, most of the slot plate 7 is embedded in the dielectric member 6. With such an arrangement again, the slot plate 7 is uniformly supported by the dielectric member 6. Thus, even if the slot plate 7 is thermally expanded, unfavorable deformation of the plate 7 is reliably prevented.

Figure 6:
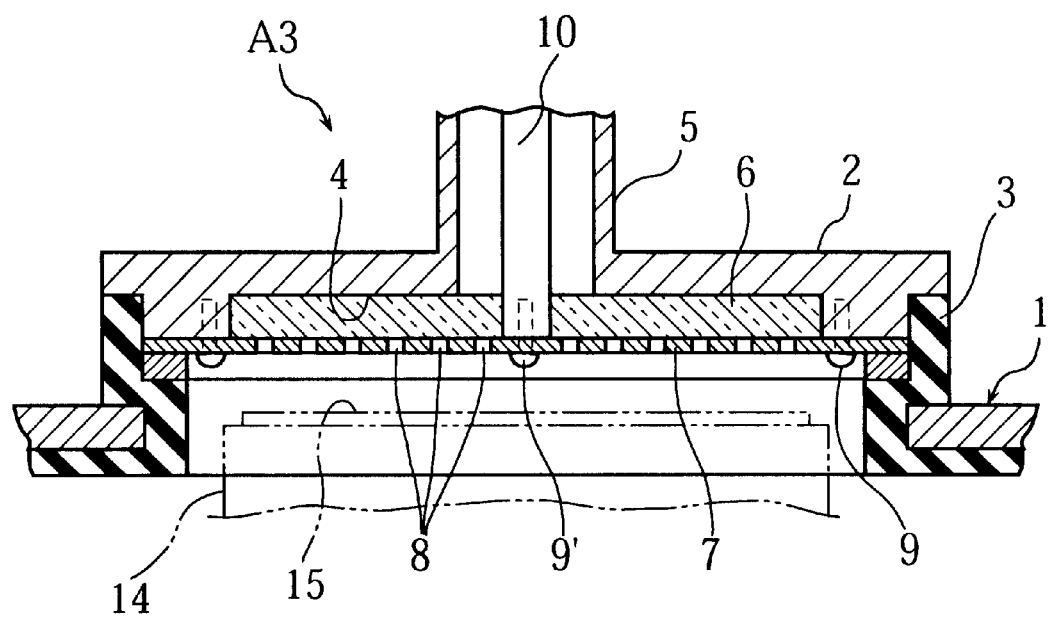
FIG. 6 is a sectional side view showing a slot antenna according to a third embodiment of the present invention.
Figure 7:
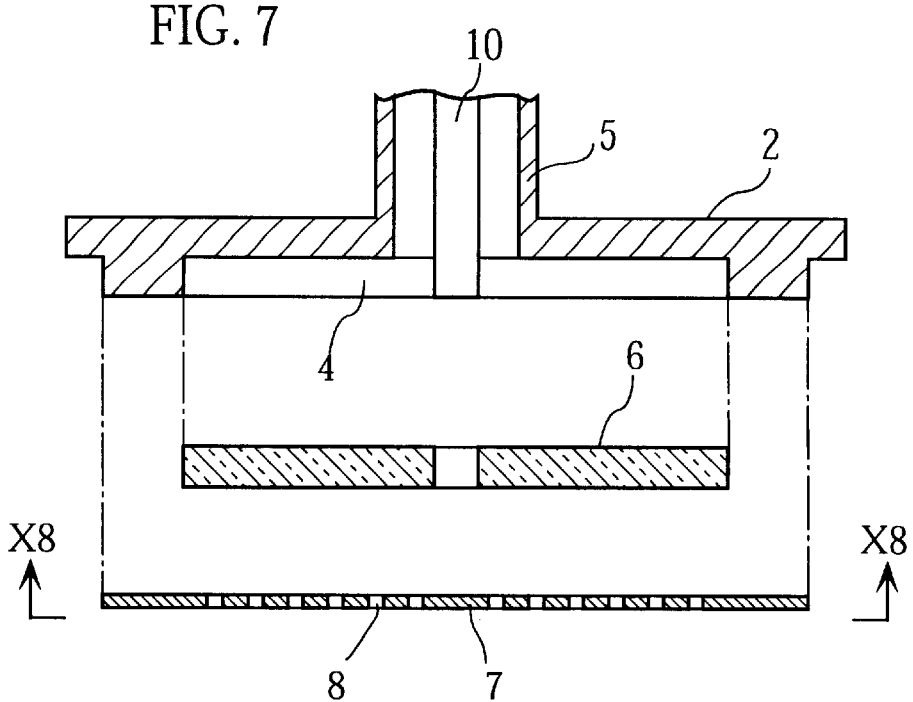
FIG. 7 is a sectional exploded view showing the slot antenna of FIG. 6.
Figure 8:
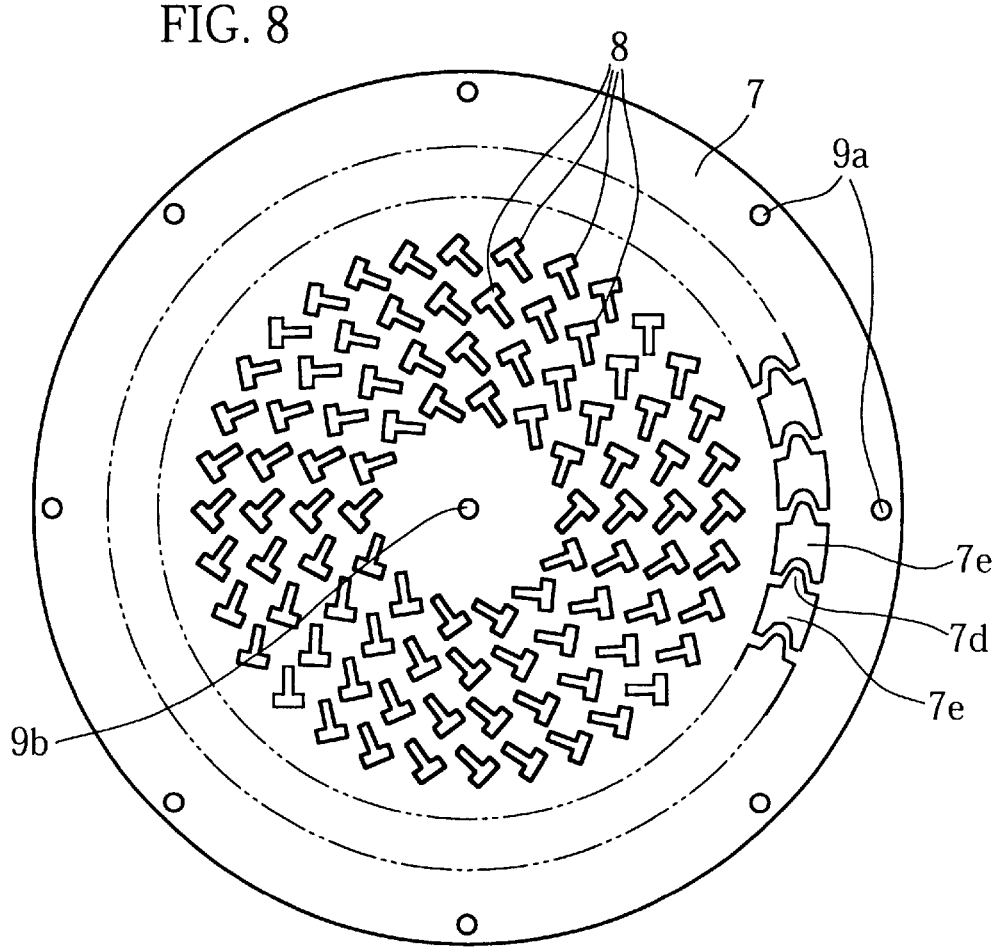
FIG. 8 is a bottom view taken along lines X8—X8 in FIG. 7.

FIGS. 6–8 show a radial line slot antenna A3 according to a third embodiment of the present invention. As seen from FIG. 6, the slot antenna A3 of this embodiment is similar to the slot antenna A2 of the second embodiment except for the following points. Specifically, as stated above, most of the slot plate 7 of the second embodiment is embedded in the dielectric member 6, and the same slot plate 7 is screwed to the antenna guide 2 only at its peripheral portion (see FIG. 4).

However, according to the third embodiment, the slot antenna A3 is provided with a slot plate 7 which is not embedded in a dielectric member 6 but held in close contact with the lower surface of the dielectric member 6. Further, the slot plate 7 is fixed, at its center, to a conductor 10 via a bolt 9', while also being fixed, in a peripheral portion, to the antenna guide 2 via a plurality of bolts 9. For insertion of the bolts 9, the slot plate 7 is formed with a plurality of bores 9a, while for insertion of the center bolt 9', the plate 7 is formed with a bore 9b (FIG. 8).

As shown in FIG. 8, the slot plate 7 is divided into two portions. Specifically, the slot plate 7 of FIG. 8 is provided with a plurality of openings 7e arranged in a circle enclosing multiple slots 8. Consequently, being defined by the circle of the openings 7e, the slot plate 7 is divided into an inner member formed with the slots 8 and an outer (or peripheral) member formed with the bores 9a. As illustrated, the inner member and the outer member are connected to each other via a plurality of narrow linking members 7d. The respective linking members 7d are uniformly curved so that each of them serves as a restoring spring. With such an arrangement, the inner member of the slot plate 7 is allowed to thermally expand in a radially outward direction of the plate 7. Thus, it is possible to prevent the plate 7 from being downwardly deformed during thermal expansion.

Figure 9:
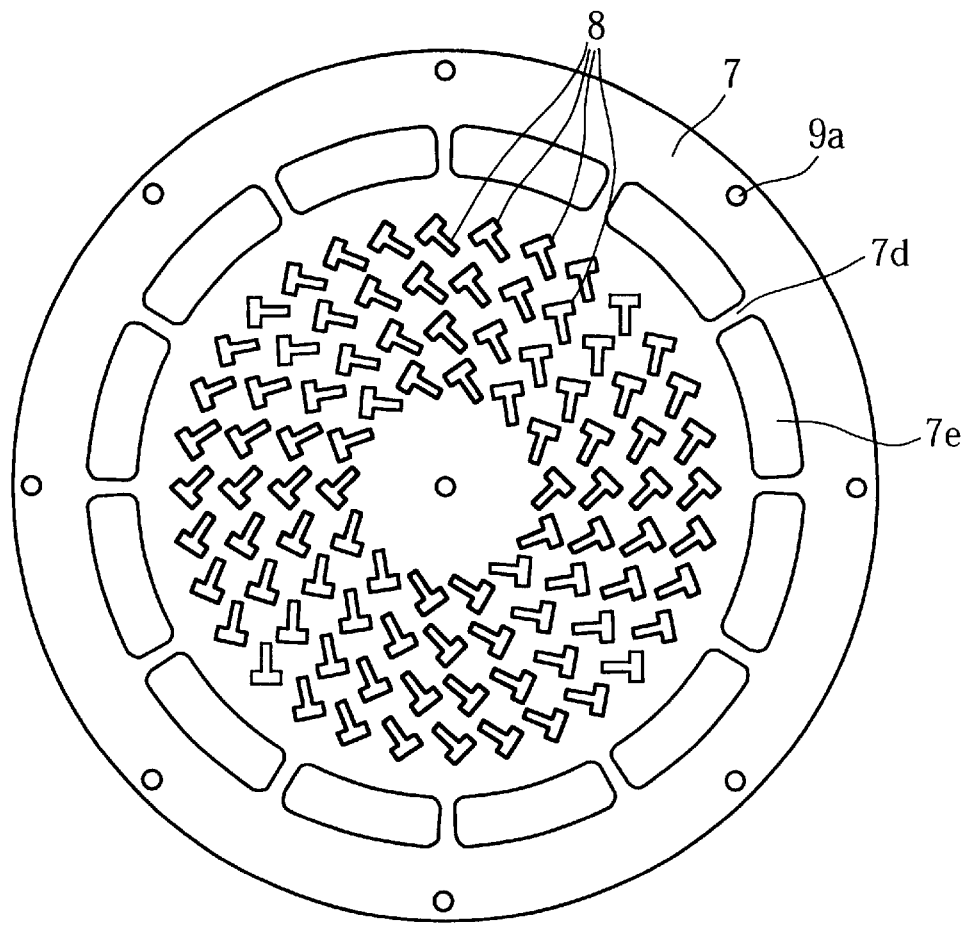
FIG. 9 is a bottom view showing a different configuration of a slot plate.

In the illustrated embodiment, the openings 7e are arranged in a single circle. However, the present invention is not limited to this, and the openings 7e may be arranged in two or more concentric circles surrounding the slots 8. Further, the linking members 7d may not need to be bent or curved as shown in FIG. 8. Instead, as shown in FIG. 9, the linking members 7d may be straight. In this instance, each opening 7e may have a generally rectangular configuration.

Figure 10:
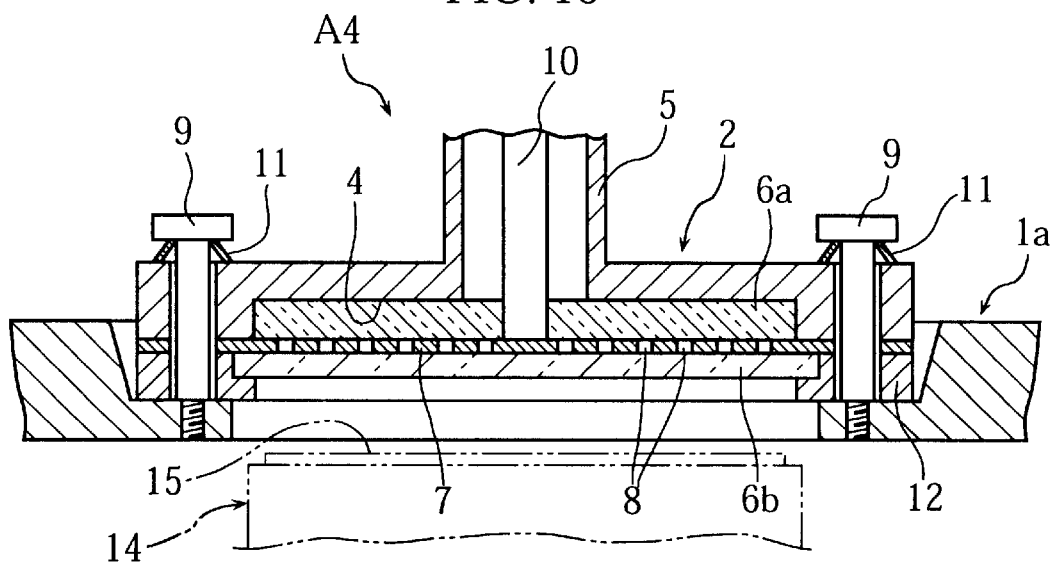
FIG. 10 is a sectional side view showing a slot antenna according to a fourth embodiment of the present invention.
Figure 11:
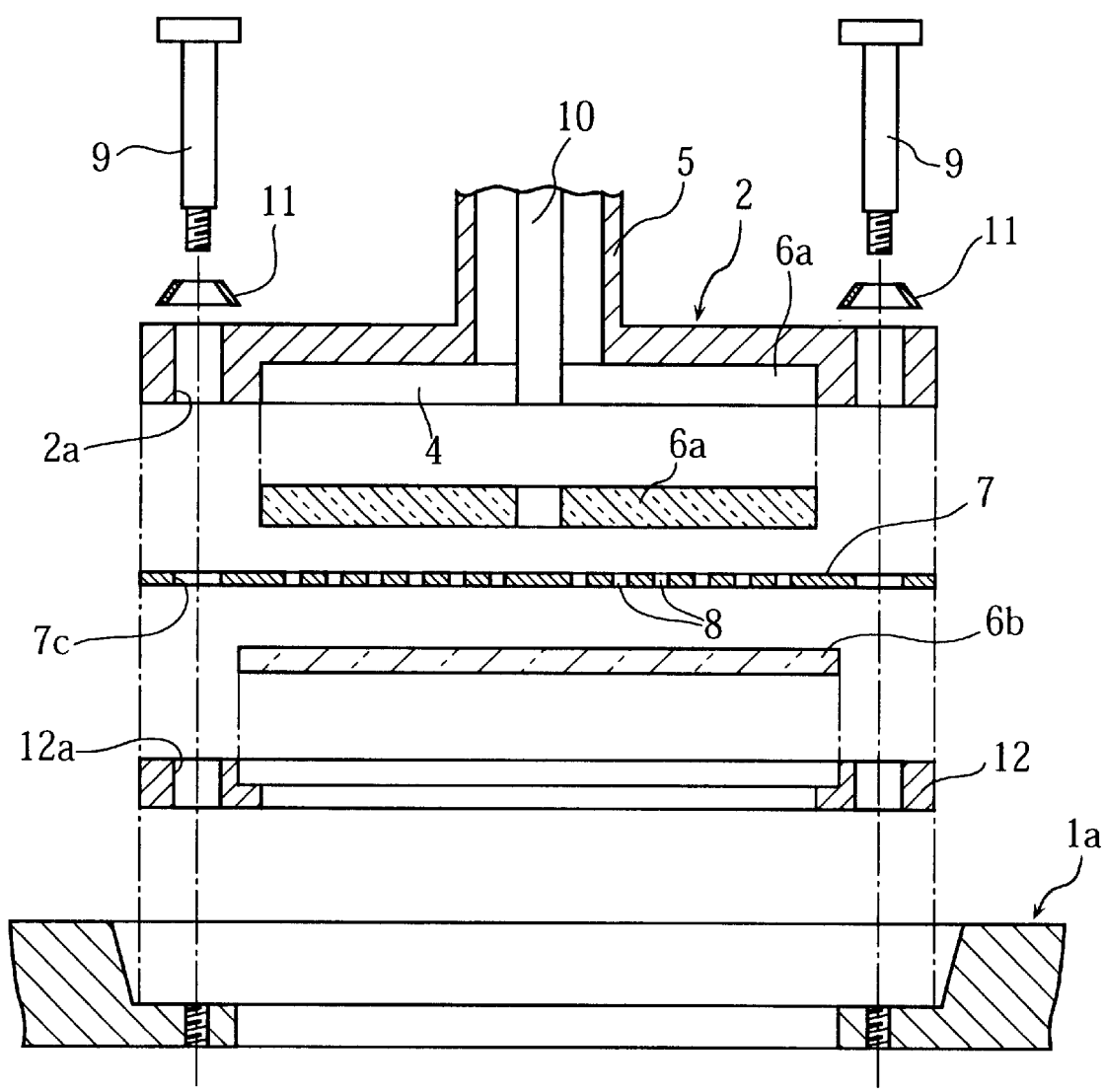
FIG. 11 is a sectional exploded view showing the slot antenna of FIG. 10.

Reference is now made to FIGS. 10 and 11 showing a radial line slot antenna A4 according to a fourth embodiment of the present invention. As illustrated, the slot antenna A4 of this embodiment is supported by a bracket 1a which in turn is mounted on a chamber (not shown) of a plasma surface processing apparatus.

The slot antenna A4 of the fourth embodiment includes an antenna guide 2 formed with a downwardly open recess 4. The slot antenna A4 also includes an upright waveguide 5 protruding from the upper surface of the antenna guide 2. A first dielectric member 6a is fitted into the recess 4 of the antenna guide 2, while being held in close contact with a slot plate 7 arranged under the first dielectric member 6a. The slot plate 7 is formed with a plurality of slots 8. The slot plate 7 is electrically connected to a conductor 10 arranged inside of the waveguide 5.

A peripheral portion of the slot plate 7 is brought into close contact with the bottom surface of the antenna guide 2. For positioning the slot plate 7 to the antenna guide 2, use is made of a ring member 12 supporting the slot plate 7 from below. As best shown in FIG. 11, the antenna guide 2, the slot plate 7 and the ring member 12 are formed with a suitable number of through-holes 2a, 7c and 12a, respectively, for allowing insertion of fixing bolts 9. The bolts 9 have a threaded end, while the bracket 1a is formed, in a retreated portion, with internally threaded bores corresponding in number and position to the through-holes 2a (hence the through-holes 7c and 12a).

With such an arrangement, the antenna guide 2, the slot plate 7 and the ring member 12 are fixed to the bracket 1a by the fixing bolts 9 screwed into the internally threaded bores of the bracket 1a. In the illustrated embodiment, use is made of a coned disc spring 11 for each fixing bolt 9, so that the antenna guide 2, the slot plate 7 and the ring member 12 are suitably pressed against the bracket 1a. It should be noted that, as shown in FIG. 10, each of the through-holes 2a, 7c and 12a is rendered greater in diameter than the shank of a corresponding bolt 9. Thus, the slot plate 7 when being heated up is horizontally expandable, within a predetermined range, with respect to the antenna guide 2 and the ring member 12.

Further, according to the fourth embodiment, use is made of a second dielectric member 6b which is held in close contact with (but not fixed to) the lower surface of the slot plate 7. The second dielectric member 6b is fitted into a recess formed in the ring member 12, with only a peripheral portion of the second dielectric member 6b being directly supported by the ring member 12.

With such an arrangement, the slot plate 7 is supported by the second dielectric member 6b from below. Thus, downward deformation of the heated slot plate 7 is advantageously prevented by the second dielectric member 6b. Further, according to the fourth embodiment, the slot plate 7 is allowed to thermally expand horizontally (i.e., radially outward, when the slot plate 7 has a disk-like configuration) relative to the second dielectric member 6b, as previously described. In this manner, downward deformation of the slot plate 7 is more effectively prevented. Still further, since the second member 6b is made of dielectric material, microwaves emitted downward via the slots 8 of the slot plate 7 are hardly blocked by the second dielectric member 6b but allowed to pass through efficiently.

Figure 12:
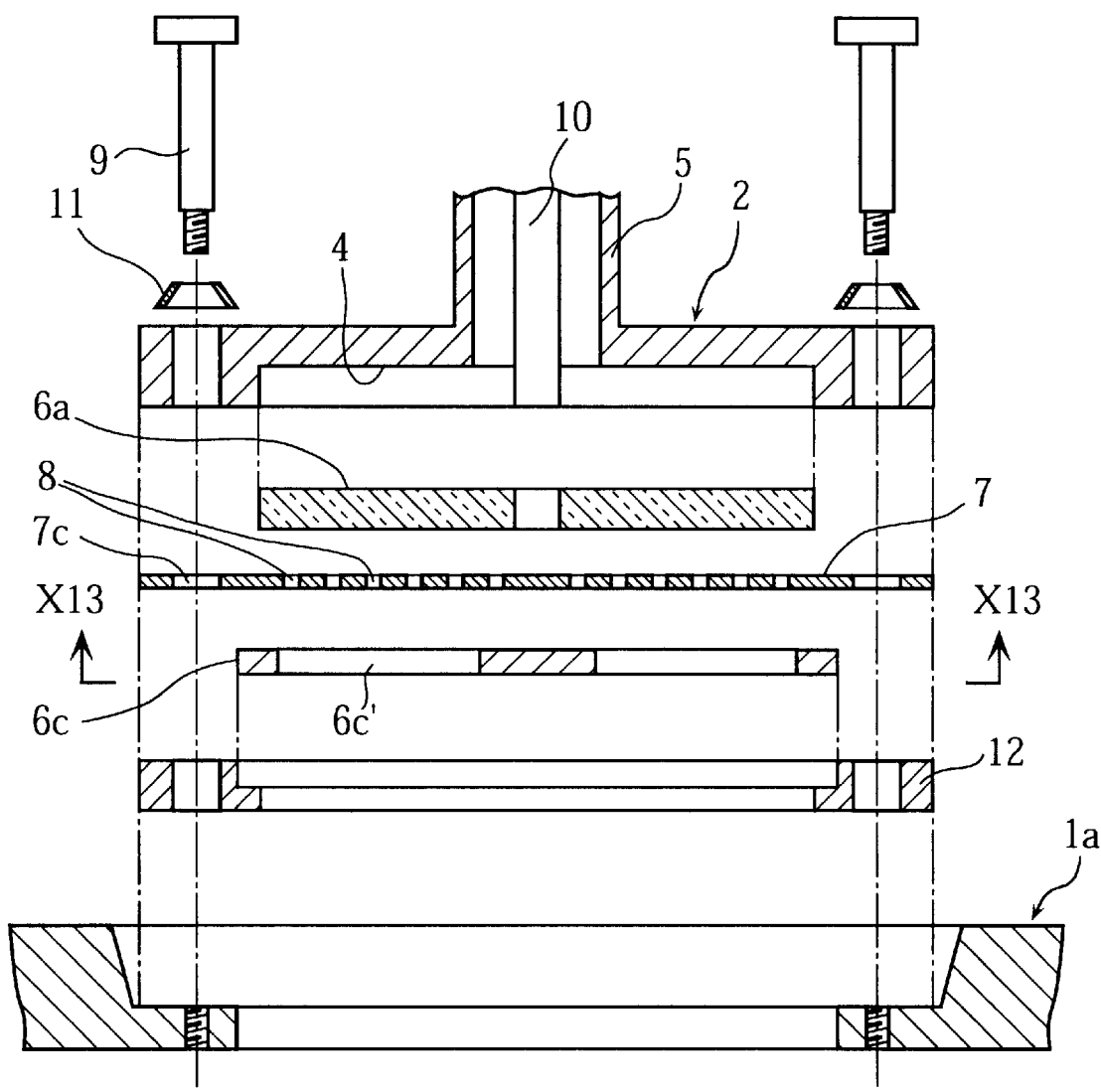
FIG. 12 is a sectional exploded view showing a modified version of the slot antenna of FIG. 10.
Figure 13:
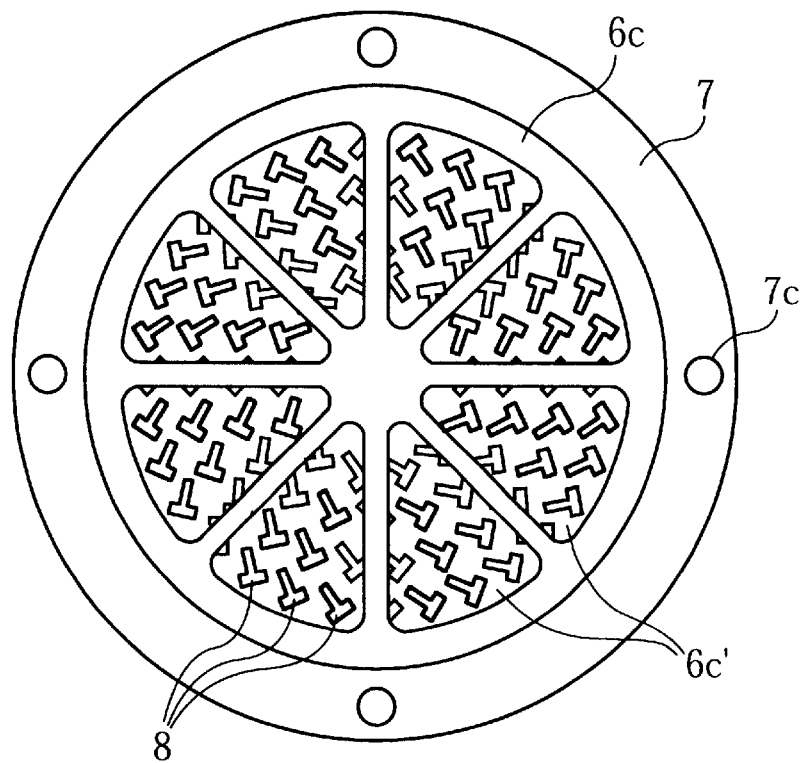
FIG. 13 is a bottom view taken along lines X13—X13 in FIG. 12.
Figure 14:
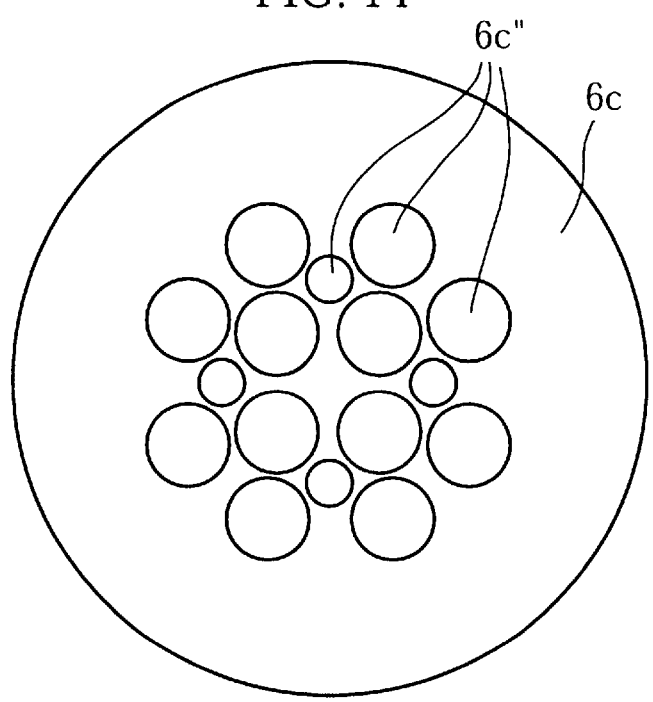
FIG. 14 is a bottom view showing a different configuration of a supporting member.

In the fourth embodiment, the slot plate 7 is supported from below by the (second) dielectric member 6b. However, the present invention is not limited to this, and the dielectric member 6b may be replaced by a metal supporting plate made of copper, for example. Specifically, as shown in FIGS. 12 and 13, a lower supporting member 6c is arranged below the slot plate 7 and fitted into the ring member 12. As best shown in FIG. 13, the lower supporting member 6c is formed with a plurality of openings 6c' for allowing the slots 8 of the slot plate 7 to be exposed downward. In the example of FIG. 13, eight openings 6c' are formed in the lower supporting member 6c, and each of them has a generally sectorial configuration. According to the present invention, however, the lower supporting member 6c may be formed with a plurality of circular openings 6c", as shown in FIG. 14. In the illustrated example, two kinds of openings 6c" are provided which differ in diameter.

Figure 15:
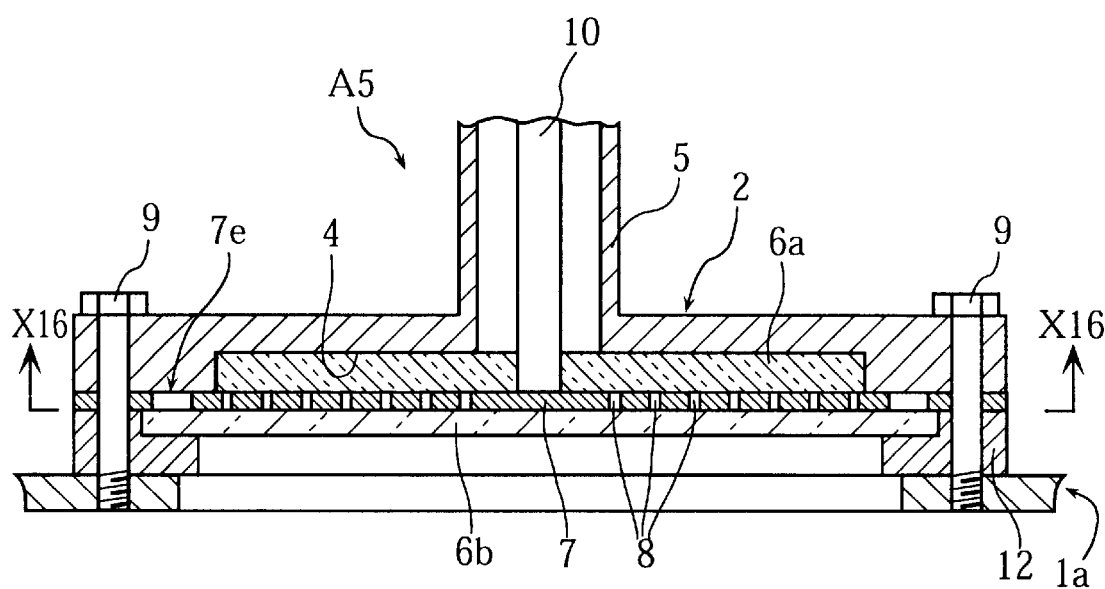
FIG. 15 is a sectional view showing a slot antenna according to a fifth embodiment of the present invention.
Figure 16:
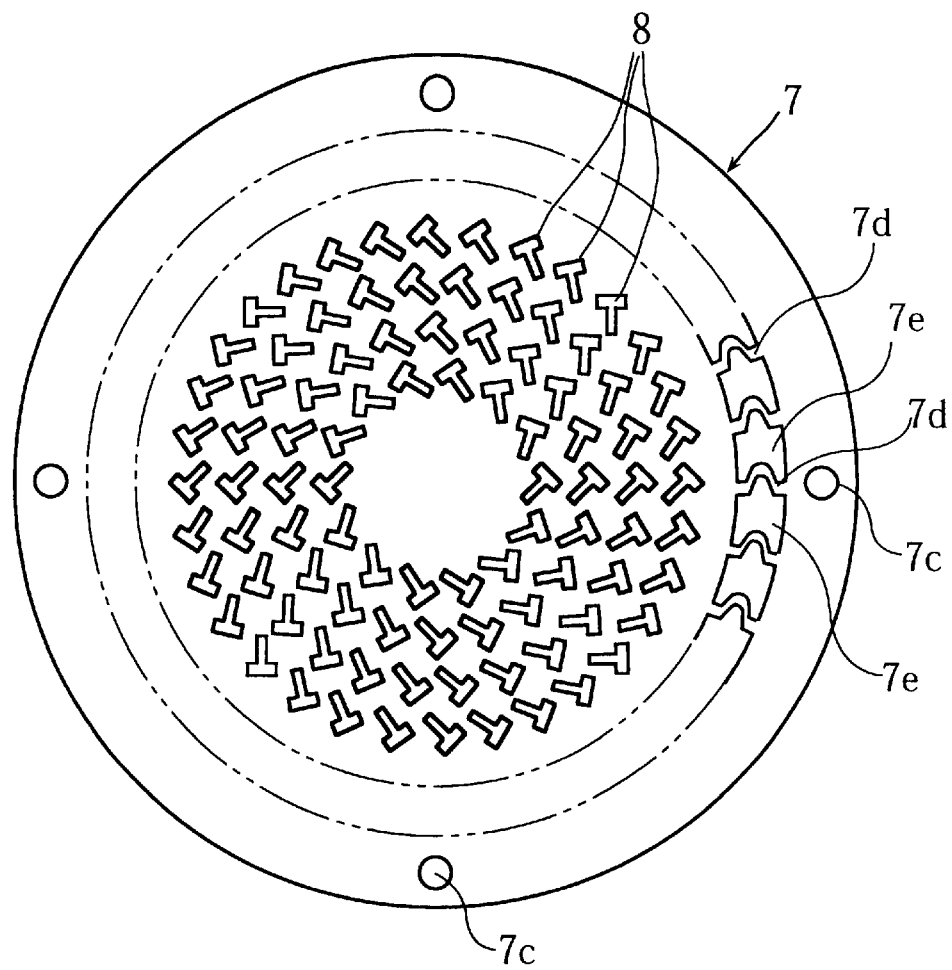
FIG. 16 is a bottom view taken along lines X16—X16 in FIG. 15.

Next, reference is made to FIGS. 15 and 16 showing a radial line slot antenna A5 according to a fifth embodiment of the present invention. As seen from FIG. 15, the slot antenna A5 of this embodiment is basically similar to the slot antenna A4 of the fourth embodiment (FIG. 10) except for the following points.

First, in the slot antenna A5 of the fifth embodiment, the shanks of the respective fixing bolts 9 are (substantially) equal in diameter to the through-holes formed in the antenna guide 2, slot plate 7 and ring member 12 for allowing insertion of the bolts 9. Second, no coned disc springs are used for the bolts 9. As a result, in the fifth embodiment, all of the antenna guide 2, slot plate 7 and ring member 12 are positionally fixed to each other at and around the respective bolts 9.

Third, the slot plate 7 of the fifth embodiment is configured as shown in FIG. 16. Specifically, the slot plate 7 of FIG. 16 is additionally formed with a plurality of openings 7e arranged in a circle enclosing the multiple slots 8. Consequently, the slot plate 7 is divided into two members: an inner member formed with the slots 8 and an outer (or peripheral) member formed with the through-holes 7c. As shown in FIG. 16, the inner member and the outer member are connected to each other via a plurality of narrow linking members 7d. The respective linking members 7d are uniformly curved so that each of them serves as a restoring spring.

When the slot antenna A5 is assembled, as shown in FIG. 15, the openings 7e of the slot plate 7 are located radially outward of the recess 4 of the antenna guide 2 but radially inward of the fixing bolts 9. In this manner, the openings 7e are closed by the antenna guide 2, which is advantageous in preventing microwaves introduced via the waveguide 5 from escaping through the openings 7e. Clearly, the openings 7e may be closed by other means such as additionally provided metal pieces mounted on the upper and/or lower surfaces of the slot plate 7. The openings 7e may also be closed by a metal supporting member used in place of the second dielectric member 6b.

The slot plate 7 of the fifth embodiment is allowed to thermally expand radially outward of the plate 7, as in the fourth embodiment (FIG. 10). Thus, in the fifth embodiment again, downward deformation of the slot plate 7 is effectively prevented not only by the mechanical support of the second dielectric member 6b but also by horizontal thermal expansion of the slot plate 7 itself.

The linking members 7d may not be bent but rendered straight. In this case, the circularly arranged openings 7e may have a generally rectangular configuration. The additional openings 7e may not be arranged in a single circle but in a plurality of concentric circles enclosing the slots 8. Further, the second dielectric member 6b may be replaced by a metal supporting member as shown in FIG. 13 or FIG. 14.

Figure 17:
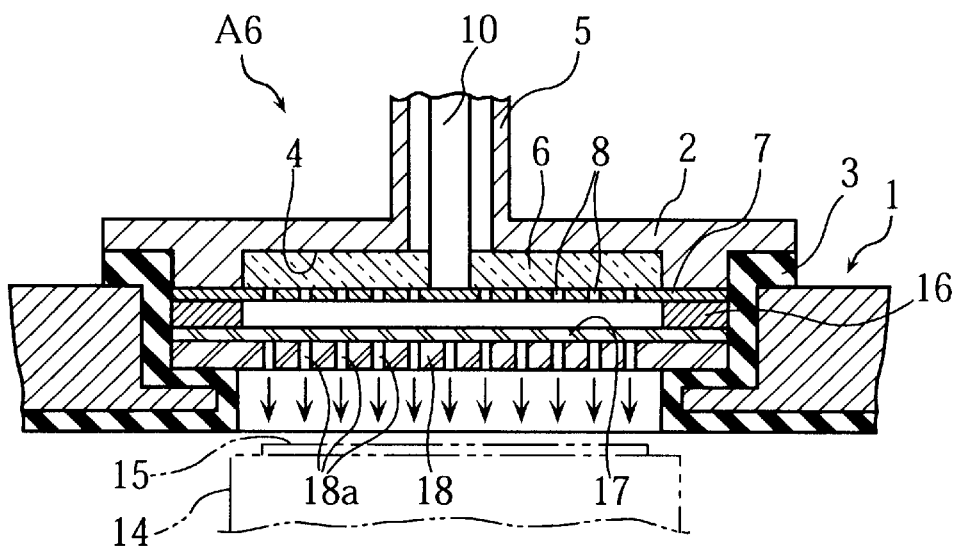
FIG. 17 is a sectional side view showing a slot antenna according to a sixth embodiment of the present invention.

FIG. 17 shows a radial line slot antenna A6 according to a sixth embodiment of the present invention.

The slot antenna A6 of this embodiment is also supported by a chamber 1 of a plasma surface processing apparatus via an insulating member 3. As in the previous embodiments, the slot antenna A6 includes an antenna guide 2 (made of e.g. aluminum) formed with a downwardly open recess 4. On the upper side, the antenna guide 2 is connected, at its central portion, to a waveguide 5 for introducing microwaves into the recess 4. A disk-like dielectric member 6 is fitted into the recess 4 of the antenna guide 2.

The lower surface of the dielectric member 6 is closely contacted with a slot plate 7 which is formed with a plurality of slots 8. The slot plate 7 is electrically connected to a conductor 10 extending through the waveguide 5. A peripheral portion of the slot plate 7 is closely attached to a lower surface of the antenna guide 2. Though not illustrated, the peripheral portion of the slot plate 7 is screwed, at a suitable number of locations, to the antenna guide 2.

A dielectric plate 17 is arranged under the slot plate 7, with a spacer ring 16 intervening therebetween. The lower surface of the dielectric plate 17 is contacted with a dielectric shower plate 18 formed with a plurality of through-holes 18a. Under the shower plate 18 is provided a lower electrode 14 on which a semiconductor substrate 15 is mounted.

According to the sixth embodiment, the dielectric member 6 is made of a ceramic material whose main component is aluminum nitride (AlN). Such AlN ceramic material has a dielectric constant of about 8.8 and a thermal conductivity of about 90–160 W/(m·K). Conventionally, use has been made of e.g. alumina ceramic material for forming a dielectric member. Generally, alumina ceramic material may have a dielectric constant of about 9.8 and a thermal conductivity of about 33 W/(m·K). In comparison with such alumina ceramic material, the AlN ceramic material has a thermal conductivity about three to five times as high, while also having a sufficiently high dielectric constant. The dielectric loss of the AlN ceramic material is advantageously low.

Thus, when the dielectric member 6 is made of AlN ceramic material, it is possible to remarkably improve the heat transfer efficiency from the slot plate 7 to the dielectric member 6 and further from the dielectric member 6 to the antenna guide 2. Consequently, the temperature of the entire slot plate 7 is kept low enough to prevent or reduce downward thermal deformation of the slot plate 7.

Figure 18:
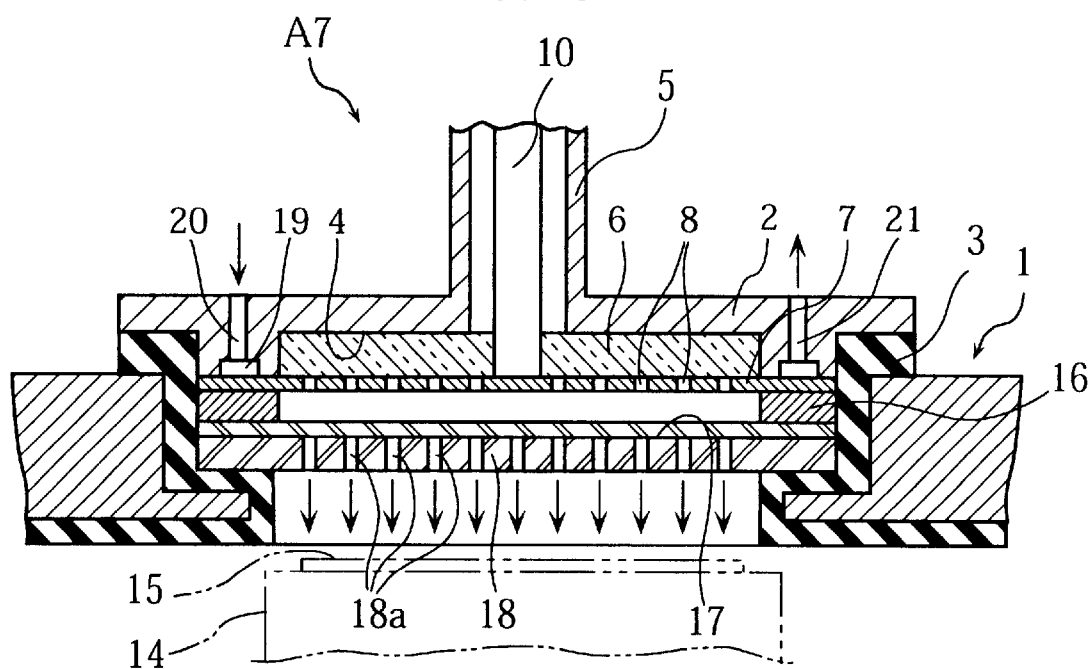
FIG. 18 is a sectional side view showing a slot antenna according to a seventh embodiment of the present invention.

FIG. 18 shows a radial line slot antenna A7 according to a seventh embodiment of the present invention. The slot antenna A7 of this embodiment is basically identical to the slot antenna A6 of FIG. 17 except for the following points. Specifically, differing from the previous slot antenna A6, the slot antenna A7 includes a antenna guide 2 formed with a continuous groove 19 extending around a circular recess 4 of the antenna guide 2. As illustrated, the groove 19 is provided in the bottom surface of the antenna guide 2, and open downwardly before being hermetically closed by a slot plate 7 attached to the antenna guide 2. The antenna guide is also formed with an inlet port 20 and an outlet port 21 both of which communicate with the groove 19. Suitable coolant (gas or liquid) is supplied into the groove 19 via the inlet port 20 and caused to exit via the outlet port 21.

With such an arrangement, a peripheral portion of the slot plate 7 is cooled by the coolant circulating through the groove 19. Thus, the temperature of the slot plate 7 as a whole is actively reduced, so that the slot plate 7 is reliably prevented from undergoing downward thermal deformation.

Figure 19:
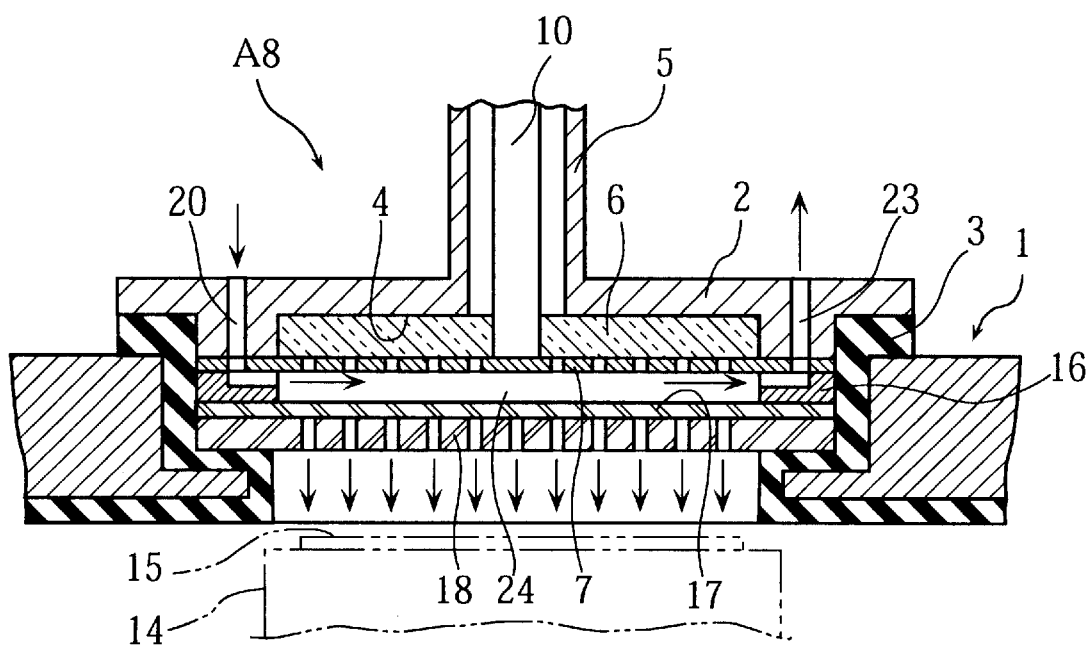
FIG. 19 is a sectional side view showing a slot antenna according to an eighth embodiment of the present invention.

FIG. 19 shows a slot antenna A8 according to an eighth embodiment of the present invention. The illustrated slot antenna A8 is basically similar to the slot antenna A7 except for the following points. Specifically, differing from the slot antenna A7, the slot antenna A8 includes an antenna guide 2 formed with an inlet port 22 and an outlet port 23. As illustrated, both of the ports 22, 23 are arranged to communicate with a hermetical passage 24 provided between a slot plate 7 and a dielectric plate 17. In operation, nonconductive coolant such as ethylene glycol is supplied into the passage 24 via the inlet port 22 and caused to exit via the outlet port 23.

With such an arrangement, the entirety of the slot plate 7 is efficiently cooled by the coolant flowing under the slot plate. It should be noted here that the cooling effect of liquid coolant is more profound than gaseous coolant. Thus, in the slot antenna of FIG. 19, downward thermal deformation of the slot plate 7 is reliably prevented by keeping the temperature of the plate 7 low enough. Further, with the use of nonconductive coolant, it is possible to prevent the coolant supplied in the passage 24 from unduly hindering the propagation of microwaves emitted downward from the slot plate 7.

Figure 20:
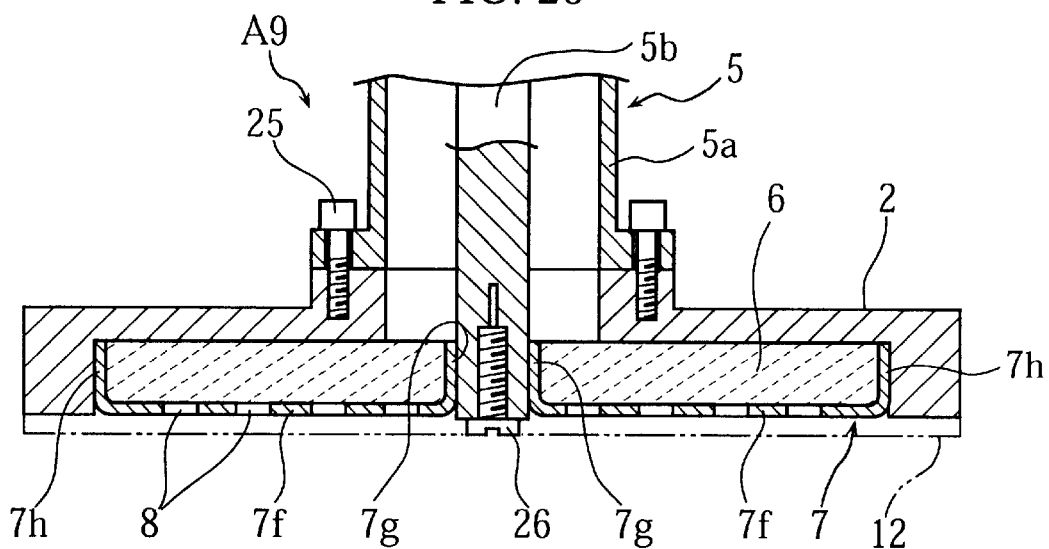
FIG. 20 is a sectional side view showing a slot antenna according to a ninth embodiment of the present invention.
Figure 21:
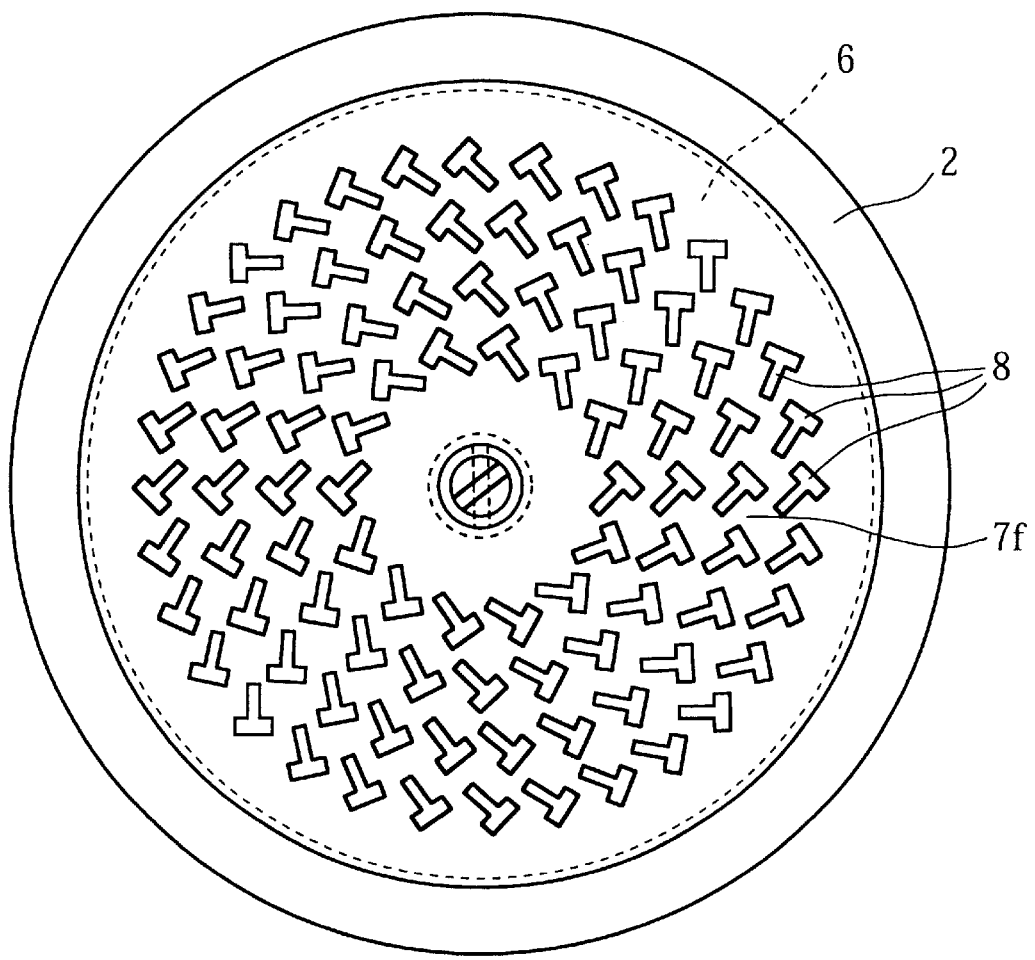
FIG. 21 is a bottom view showing the slot antenna of FIG. 20.
Figure 22:
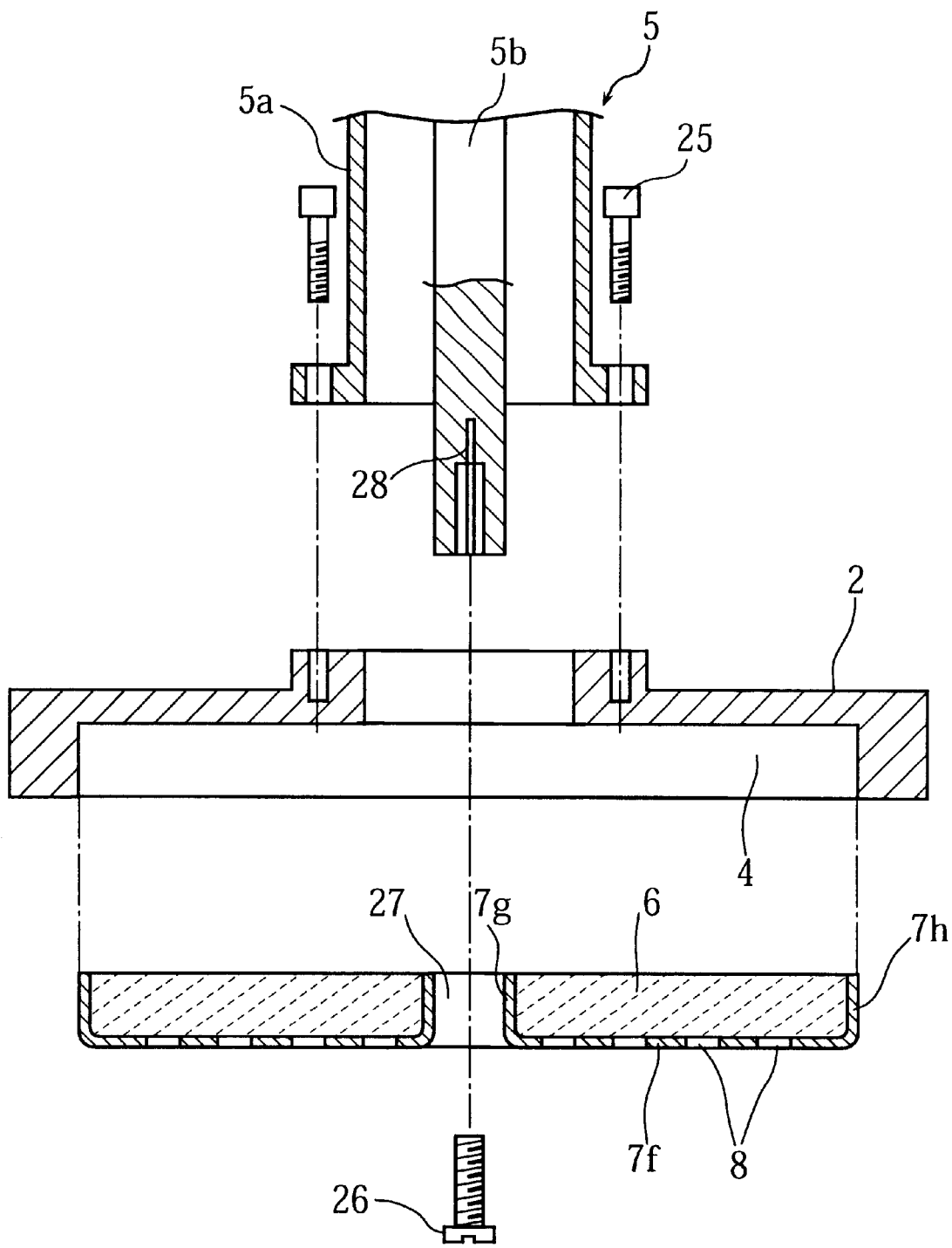
FIG. 22 is a sectional exploded view showing the slot antenna of FIG. 22.

Reference is now made to FIGS. 20–22 showing a radial line slot antenna A9 according to a ninth embodiment of the present invention. As illustrated, the slot antenna A9 includes a conductive antenna guide 2 made of e.g. aluminum and a disk-like dielectric member 6 made of e.g. alumina ceramic material. A conductive slot layer 7 is formed on the dielectric member 6 except for the upper surface of the dielectric member 6. The slot layer 7 includes a bottom portion 7f, an inner annular portion 7g and an outer annular portion 7h. The inner and outer annular portions 7g, 7h are formed integral with the bottom portion 7f. As best shown in FIG. 21, the bottom portion 7f is provided with a plurality of slots 8. The thus configured slot layer 7 may be produced by electroless plating, as will be described later.

The dielectric member 6 coated with the slot layer 7 is fitted into a recess 4 formed in the bottom of the antenna guide 2 (see FIG. 22). When assembled, the outer annular portion 7h of the slot layer 7 is held in pressing contact with the antenna guide 2. For achieving this, the antenna guide 2 is heated up to a predetermined temperature before insertion of the dielectric member 6 into the recess 4, while the dielectric member 6 has been cooled beforehand. Then, the dielectric member 6 is fitted into the recess 4, and finally the antenna guide 2 is cooled. As a result, the dielectric member 6 is firmly held in the recess 4, with the outer annular portion 7h properly connected to the antenna guide 2. optionally, use may be made of a fixing ring 12 (FIG. 20) attached to the lower peripheral portion of the antenna guide 2 by e.g. screws (not shown). In this manner, the dielectric member 6 is more reliably held in the recess 4.

As shown in FIGS. 20 and 22, a waveguide 5 is attached to a central portion of the upper surface of the antenna guide 2 by a suitable number of bolts 25. More precisely, the waveguide 5 is provided with a conductive outer pipe 5a, which is bolted to the antenna guide 2, and a conductive inner shaft 5b coaxially supported within the outer pipe 5a. The lower end of the inner shaft 5b is fitted into a through-hole 27 (FIG. 22) defined by the inner annular portion 7g of the slot layer 7. In this manner, the inner shaft 5b is electrically connected to the slot layer 7.

For ensuring proper electrical connection of the inner shaft 5b to the inner annular portion 7g of the slot layer 7, the following arrangement is adopted. As shown in FIG. 22, the lower end of the inner shaft 5b is formed with an expanding slot 28. In assembly, first the lower end of the shaft 5b is inserted into the through-hole 27 of the dielectric member 6, and then a bolt 26 is screwed into the lower end of the shaft 5b. Thus, the lower end of the shaft 5b is properly increased in diameter or caused to expand due to the expanding slot 28. As a result, the lower end of the shaft 5b is appropriately pressed onto the inner annular portion 7g of the slot layer 7, thereby causing the shaft 5b to be firmly held in the through-hole 27. Preferably, the bolt 26 may have a tapered shank, so that the expansion of the lower end of the shaft 5b will become greater as the bolt 26 is driven further into the shaft 5b.

Figure 23A:
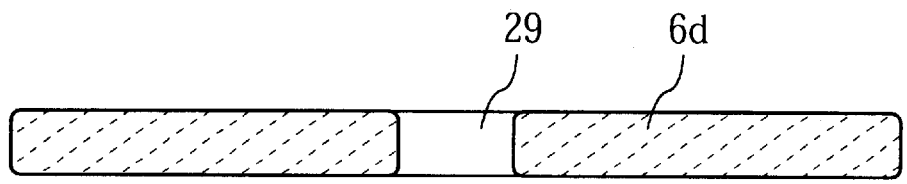
FIGS. 23A–23B and 24A–24B show steps for forming conductive layers on a dielectric member.
Figure 23B:
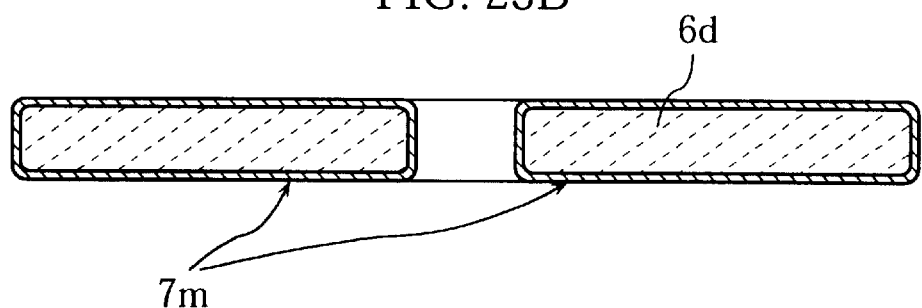

The slot layer 7 on the dielectric member 6 may be formed in the following manner. First, referring to FIG. 23A, a disk-like dielectric member 6d may be prepared. As illustrated, the dielectric member 6d is provided with a center bore 29. Then, the entirety of the dielectric member 6d is immersed in an electroless copper-plating bath, thereby forming a conductive copper layer 7m of a predetermined thickness over the dielectric member 6d, as shown in FIG. 23B. Finally, the copper layer formed on the upper surface of the dielectric member 6d is removed by e.g. etching utilizing photolithography. Likewise, a plurality of slots may be formed in the bottom portion of the copper layer 7m. Thus, as shown in FIG. 20, the dielectric member 6 with the slot layer 7 formed thereon is obtained.

By the method described above, initially the copper layer 7m is formed over the entirety of the dielectric member 6d (FIG. 23B), and then partially removed by etching for exposing the upper surface of the dielectric member 6d and for forming the slots 8 (FIG. 20). Alternatively, before being subjected to electroless plating, the dielectric member 6d may be partially covered by masks. Specifically, the masks are provided on the upper surface of the dielectric member 6d and at predetermined locations of the bottom surface which correspond to the multiple slots 8. Then, the dielectric member 6d may be immersed in an electroless copper-plating bath.

According to the ninth embodiment of the present invention, the slot layer 7 is electrically connected to the outer pipe 5a of the waveguide 5 via the antenna guide 2, while also being connected to the inner shaft 5b of the waveguide 5. Further, the bottom portion 7f of the slot layer 7 is formed with a plurality of through-holes (slots 8). With such an arrangement, the bottom portion 7f of the slot layer 7 serves as a slot plate as described in connection with the previous embodiments. As easily understood, the bottom portion 7f (as a slot plate) is uniformly fixed to the dielectric member 6. Thus, it is possible to reliably prevent the bottom portion 7f from undergoing downward thermal deformation.

Figure 24A:
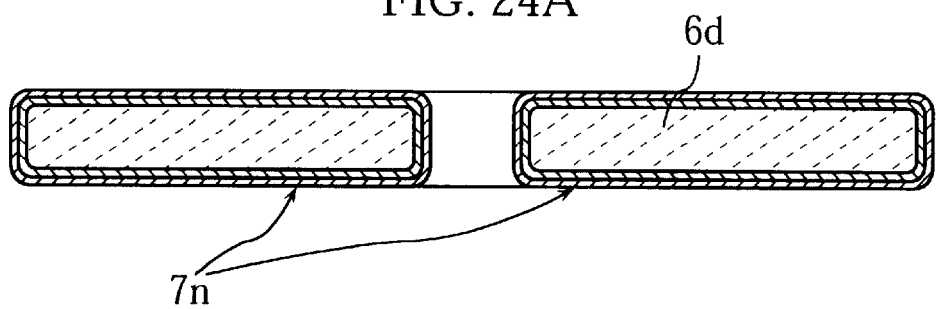

In the slot antenna A9 of FIG. 20, the slot layer 7 is made up of a single copper layer. However, the present invention is not limited to this example. For instance, the slot layer 7 may be made up of at least two kinds of conductive layers (sub-layers). In this case, initially a sub-layer 7n may be formed directly on the dielectric member 6d, as shown in FIG. 23B, and then an overlapping sub-layer 7n, as shown in FIG. 24A, may be formed over the underlying sub-layer 7m. The underlying sub-layer 7m may be a copper layer, while the overlapping sub-layer 7n may be a nickel layer.

For forming an overlapping layer of nickel, the dielectric member 6d with the underlying layer 7m is immersed in an electrolytic nickel-plating bath, and this step is followed by application of appropriate current. The nickel overlapping layer 7n is advantageous since nickel is an excellent conductive material which has low susceptibility to oxidation and high durability.

Figure 24B:
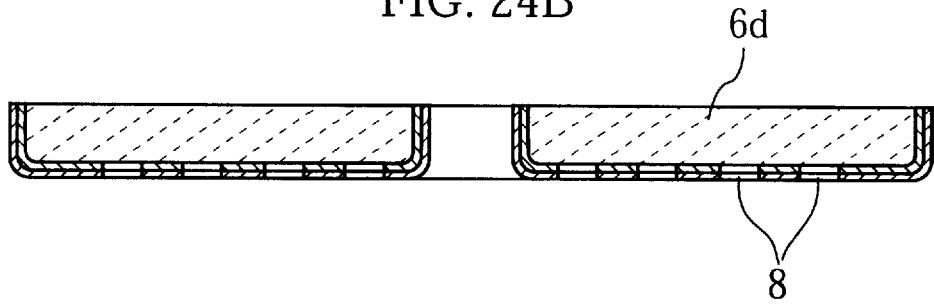

After the two kinds of sub-layers 7m, 7n are formed over the dielectric member 6d, part of these layers may be removed by etching for the purposes of exposing the entire upper surface of the dielectric member 6d and forming a plurality of slots 8 on the lower side of the dielectric member 6d, as shown in FIG. 24B.

According to the above-described method, the underlying sub-layer 7m is formed by electroless plating, whereas the overlapping sub-layer 7n is formed by electrolytic plating. In this way, the slot layer 7, which is made up of the two sub-layers 7m and 7n, is produced quicker than when the two sub-layers are both formed by electroless plating.

Figure 25:
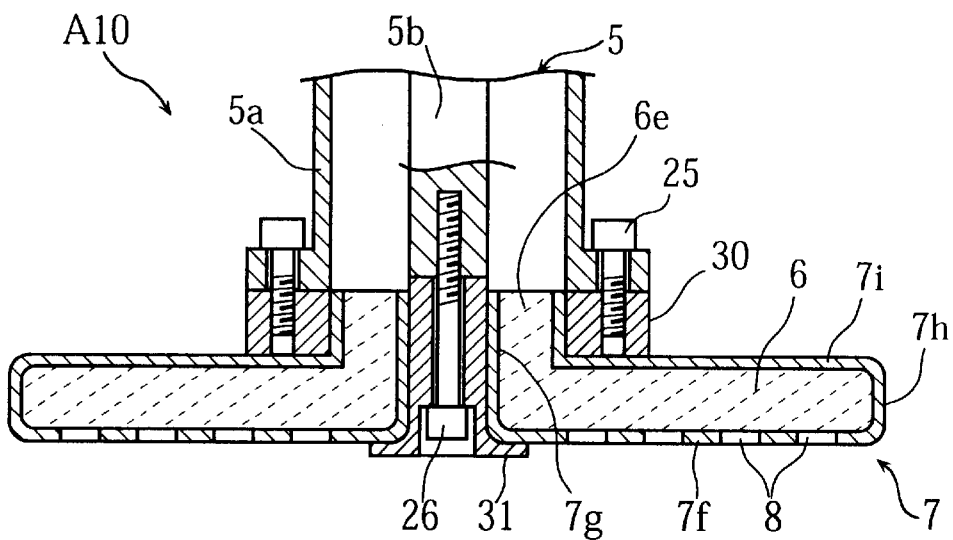
FIG. 25 is a sectional side view showing a slot antenna according to a tenth embodiment of the present invention.
Figure 26:
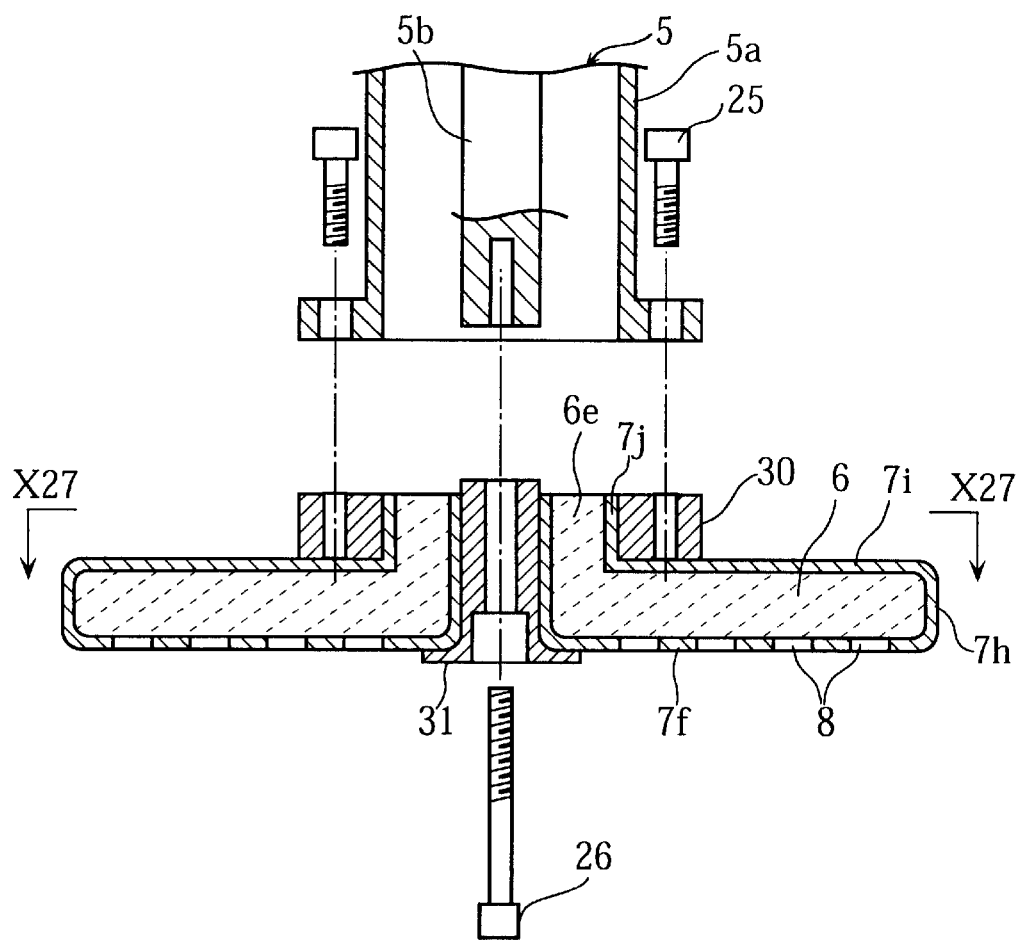
FIG. 26 is a partially exploded view showing the slot antenna of FIG. 25.

Reference is now made to FIGS. 25–28 showing a radial line slot antenna A10 according to a tenth embodiment of the present invention. The illustrated slot antenna A10 includes a dielectric member 6 which is provided with a disk-like base portion and an upright annular portion 6e protruding from the base portion. Except for its upper surface, the dielectric member 6 is coated with a conductive layer 7. As shown in FIG. 25 or 26, the conductive layer 7 is provided with a bottom portion 7f, an annular inner portion 7g, an annular outer portion 7h, a horizontal upper portion 7i and an annular intermediate portion 7j. These portions 7f–7j are integrally formed with each other. The bottom portion 7f is formed with a plurality of slots 8 for partially exposing the bottom surface of the dielectric member 6.

Figure 28:
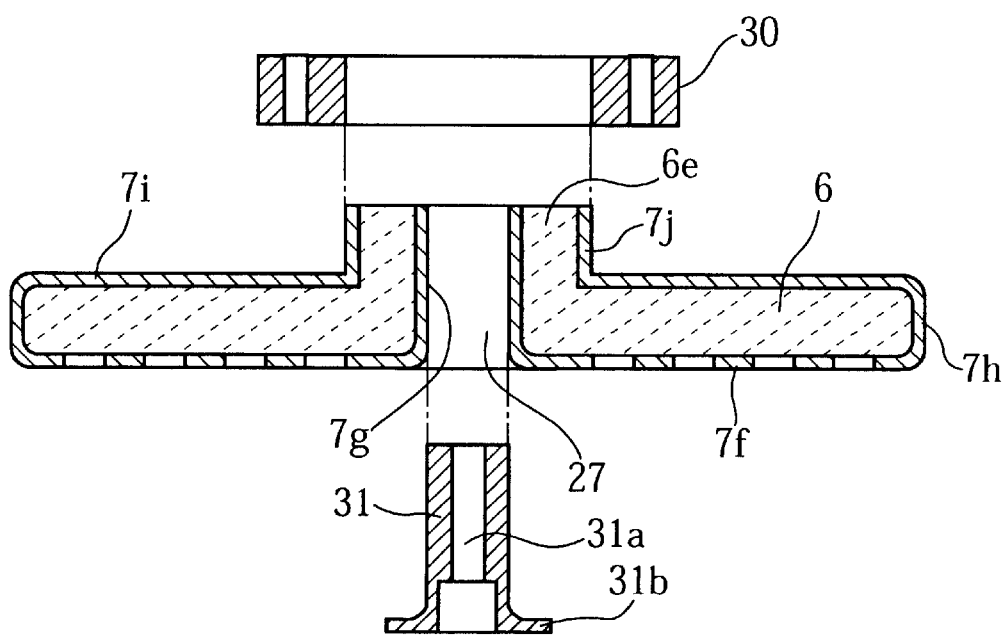
FIG. 28 is a sectional exploded view showing principal elements of the slot antenna of FIG. 25.

As best shown in FIG. 28, the dielectric member 6 with the conductive layer 7 defines a central bore 27 into which a conductive fixing piece 31 is fitted. The fixing piece 31, which may be made of copper, is formed with a through-hole 31a for allowing insertion of a bolt 26 (see FIG. 26) and with a flange 31b. When inserted into the through-hole 31a, the shank of the fixing piece 31 is held in close contact with the inner portion 7g of the conductive layer 7, while its flange 31b comes into engagement with the bottom portion 7f of the conductive layer 7. In this state, the fixing piece 31 is connected to a conductive inner shaft 5b of a waveguide 5 with the bolt 25, as shown in FIGS. 25 and 26. As illustrated, the waveguide 5 is provided with a conductive outer pipe 5a coaxially enclosing the inner shaft 5b. Optionally, the flange 31b of the fixing piece 31 may be soldered to the bottom portion 7f of the conductive layer 7.

Figure 27:
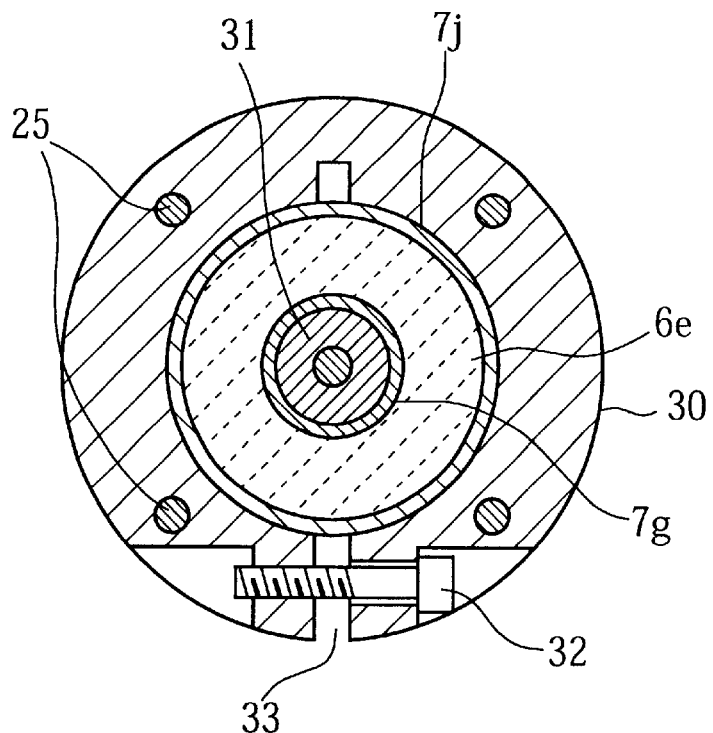
FIG. 27 is a view taken along lines X27—X27 in FIG. 26.

As best shown in FIG. 28, the upright annular portion 6e of the dielectric member 6 is fitted into a conductive ring 30 so that the annular intermediate portion 7j of the conductive layer 7 is electrically connected to the ring 30. As shown in FIG. 27, the ring 30 is formed with a slit 33 for facilitating the insertion of the annular portion 6e of the dielectric member 6. The ring 30 is firmly fixed to the annular portion 6e by tightening a bolt 32 arranged at the slit 33. Alternatively or optionally, the ring 30 may be soldered to the upper portion 7i and the intermediate portion 7j of the conductive layer 7. As shown in FIGS. 25 and 26, the outer pipe 5a is fixed to the ring 30 with a suitable number of bolts 25.

Figure 29A:
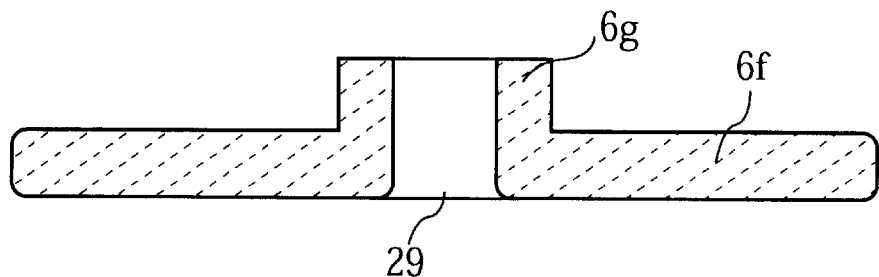
FIGS. 29A–29D show steps for forming conductive layers on a dielectric member.

Referring to FIGS. 29A–29D, the conductive layer 7 may be formed in the following manner. First, as shown in FIG. 29A, a dielectric member 6f is prepared. The dielectric member 6f is provided, at its center, with an upright portion 6g protruding from the upper surface of the dielectric member 6f. A bore 29 extending through the upright portion 6g is formed in the dielectric member 6f.

Figure 29B:
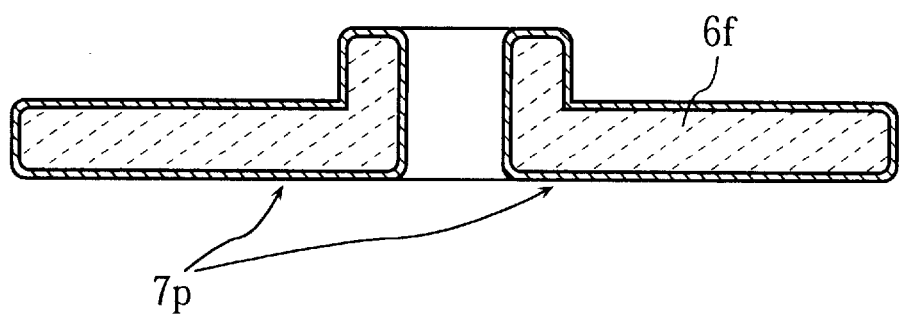

Then, as shown in FIG. 29B, a conductive layer 7p of e.g. copper is formed over the entirety of the dielectric member 6f. For this purpose, the dielectric member 6f may be subjected to electroless plating, as described with reference to FIG. 22B. Then, predetermined parts of the conductive layer 7p are removed by e.g. etching so as to expose the upper end 6h of the dielectric and to form slots 8, as shown in FIG. 29D.

Figure 29C:
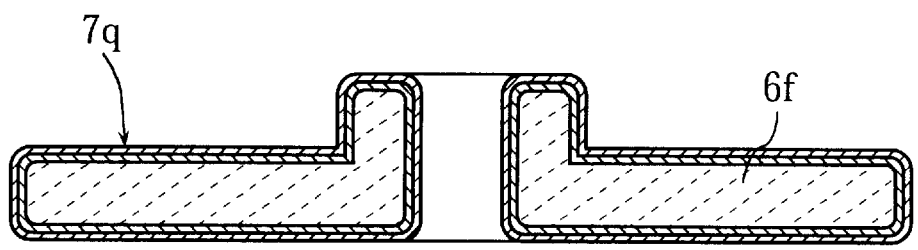
Figure 29D:
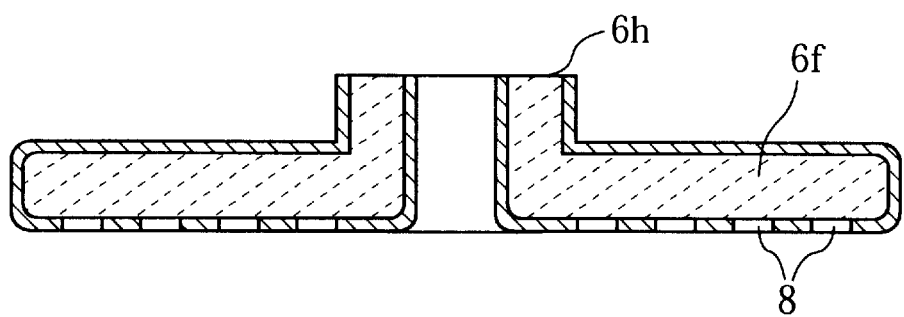

As shown in FIG. 29C, an overlapping conductive layer 7q may be additionally formed over the first conductive layer 7p before the above-mentioned etching is performed. The overlapping conductive layer 7q may be formed by nickel-plating.

Figure 30:
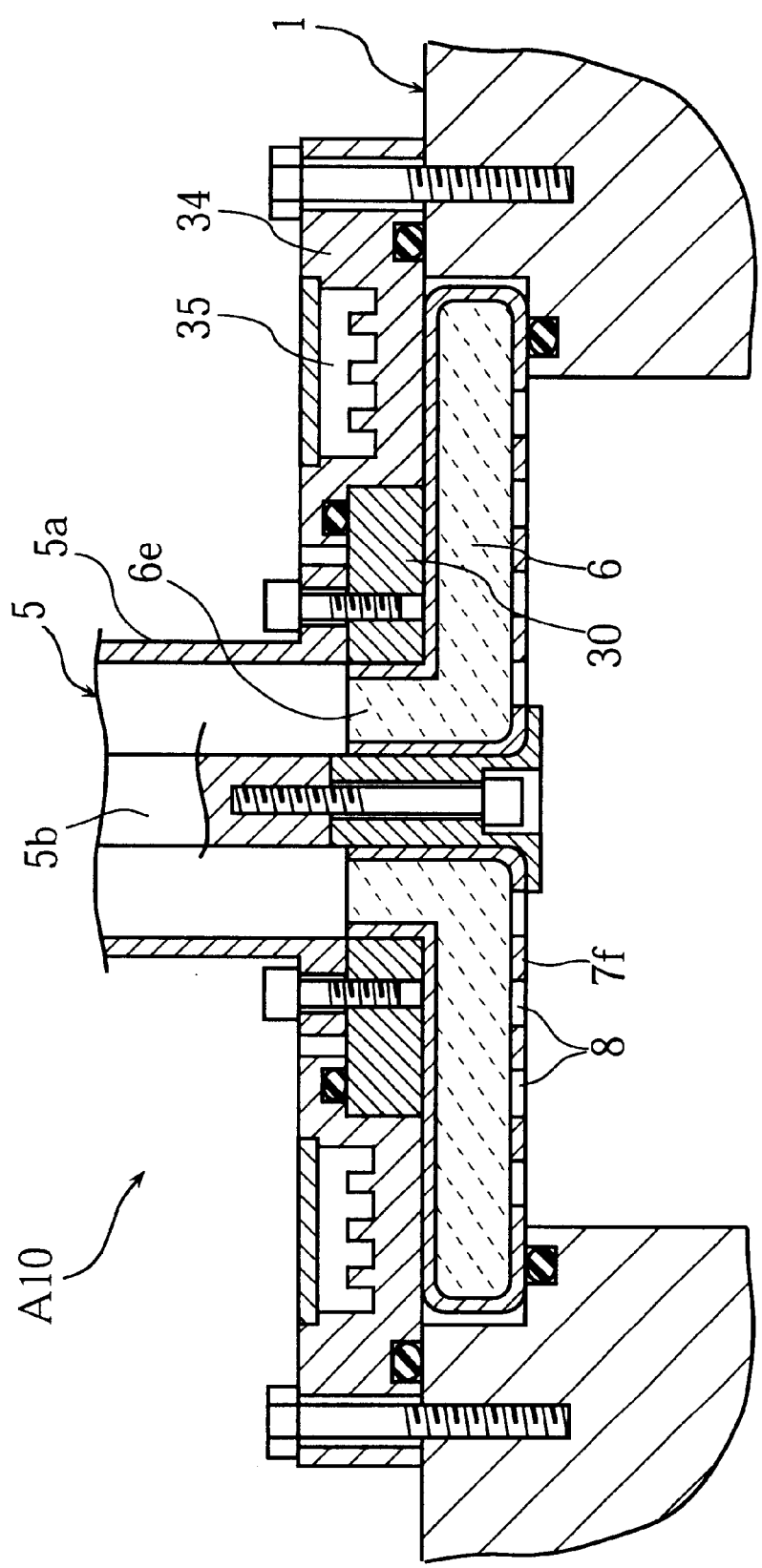
FIG. 30 is a sectional view showing the slot antenna of FIG. 25 mounted on the chamber of a plasma surface processing apparatus.

Referring to FIG. 30, the slot antenna A10 of the tenth embodiment may be mounted on the chamber 1 of a plasma surface processing apparatus. As illustrated, the chamber 1 is formed with a recess into which the dielectric member 6 is fitted. For fixing the slot antenna A10 to the chamber 1, use is made of a metal cover 34 which is bolted to the chamber 1. The cover 34 is formed with a passage 35 for circulating coolant (cold water for example) to prevent the slot antenna A10 from being unduly heated.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A slot antenna for plasma surface process comprising:
   a metal antenna guide formed with a recess;
   a dielectric member received in the recess;
   a metal slot plate held in contact with the dielectric member, the slot plate being provided with a plurality of slots;
   a waveguide connected to the antenna guide for introduction of microwaves; and
   a protective coating formed on the slot plate in contact therewith, the protective coating extending into the slots.

2. The slot antenna according to claim 1, wherein the slot plate comprises a metal layer which is closely attached to the dielectric member.

3. The slot antenna according to claim 2, wherein the metal layer is formed by electroless plating.

4. The slot antenna according to claim 1, wherein the slot plate comprises a copper-plated layer and a nickel-plated layer.

5. A slot antenna for plasma surface process comprising:
   a metal antenna guide formed with a recess;
   a dielectric member made of a dielectric material and received in the recess;
   a metal slot plate provided with a plurality of slots; and
   a waveguide connected to the antenna guide for introduction of microwaves;
   wherein at least part of the slot plate is embedded in the dielectric member, the slot plate having a first surface and a second surface opposite to the first surface, both of the first and second surfaces of the slot plate being held in contact with the dielectric member, the dielectric material of the dielectric member filling the slots.

6. A slot antenna for plasma surface process comprising:
   a metal antenna guide formed with a recess;
   a first dielectric member received in the recess;
   a metal slot plate having a first surface held in contact with the first dielectric member, the slot plate also having a second surface opposite to the first surface, the slot plate being provided with a plurality of slots;
   a second dielectric member held in contact with the second surface of the slot plate; and
   a waveguide connected to the antenna guide for introduction of microwaves.

7. A slot antenna for plasma surface process comprising:
   a metal antenna guide formed with a recess;
   a dielectric member received in the recess and provided with a central through-hole;
   a conductive slot layer formed on the dielectric member, the slot layer being provided with a plurality of slots, the slot layer having an annular portion extending into the central through-hole of the dielectric member; and
   a waveguide connected to the antenna guide for introduction of microwaves, the waveguide having a conductive shaft inserted into the central through-hole of the dielectric member, in contact with the annular portion of the slot layer.

8. A slot antenna for plasma surface process comprising:
   a metal antenna guide formed with a recess;
   a dielectric member received in the recess and provided with a central through-hole;
   a conductive slot layer formed on the dielectric member, the slot layer being provided with a plurality of slots, the slot layer having an annular portion extending into the central through-hole of the dielectric member;
   a waveguide connected to the antenna guide for introduction of microwaves, the waveguide having a conductive shaft oriented toward the central through-hole of the dielectric member,
   a conductive fixing piece inserted into the central through-hole of the dielectric member in contact with the annular portion of the slot layer and connected to the conductive shaft.

9. A slot antenna for plasma surface process comprising:
   a metal antenna guide formed with a recess;
   a dielectric member received in the recess;
   a metal slot plate held in contact with the dielectric member; and
   a waveguide connected to the antenna guide for introduction of microwaves;
   wherein the slot plate is divided by an annular row of openings into an inner portion and an outer portion, the inner portion of the slot plate being provided with a plurality of slots, each of which is smaller in size than each of said openings, the outer portion of the slot plate being fixed to the antenna guide.

10. The slot antenna according to claim 9, wherein the inner portion and the outer portion of the slot plate are connected to each other by deformable linking members between said openings.

11. The slot antenna according to claim 9, wherein said annular row of openings is closed by the antenna guide.

12. The slot antenna according to claim 9, further comprising urging means for pressing the outer portion of the slot plate against the antenna guide.

13. The slot antenna according to claim 9, further comprising a second dielectric member arranged under the slot plate for supporting the slot plate.

14. A slot antenna for plasma surface process comprising:
   a metal antenna guide formed with a recess;
   a dielectric member received in the recess;
   a metal slot plate held in contact with the dielectric member, the slot plate having a central portion provided with a plurality of slots, the slot plate also having a peripheral portion provided with a plurality of through-holes;
   a waveguide connected to the antenna guide for introduction of microwaves; and
   a plurality of bolts loosely extending through the through-holes of the slot plate for attaching the peripheral portion of the slot plate to the antenna guide.

15. The slot antenna according to claim 14, further comprising a metal supporting member arranged under the slot plate for supporting the slot plate, the metal supporting member being formed with a plurality of openings.

16. The slot antenna according to claim 14, wherein the dielectric member is made of AlN ceramic material.

* * * * *